(12) United States Patent
Kim et al.

(10) Patent No.: US 12,124,319 B2
(45) Date of Patent: Oct. 22, 2024

(54) DYNAMIC PEAK POWER CONTROL

(71) Applicant: Microsoft Technology Licensing, LLC, Redmond, WA (US)

(72) Inventors: Donghwi Kim, Kirkland, WA (US); Gregory Allen Nielsen, Kirkland, WA (US); Mika Juhani Rintamaeki, Redmond, WA (US); Timothy A Jakoboski, Woodinville, WA (US); Manish K. Shah, Redmond, WA (US); Rajagopal K. Venkatachalam, Woodinville, WA (US); Minsoo Kim, Bothell, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 168 days.

(21) Appl. No.: 17/322,705

(22) Filed: May 17, 2021

(65) Prior Publication Data

US 2022/0365586 A1 Nov. 17, 2022

(51) Int. Cl.
*G06F 1/3296* (2019.01)
*G06F 1/28* (2006.01)
(Continued)

(52) U.S. Cl.
CPC .......... *G06F 1/3296* (2013.01); *G06N 20/00* (2019.01); *H03K 5/24* (2013.01)

(58) Field of Classification Search
CPC ......... G06F 1/3296; G06N 20/00; H03K 5/24
See application file for complete search history.

(56) References Cited

U.S. PATENT DOCUMENTS 8,310,850 B2 11/2012 Polivka
9,444,364 B2 9/2016 Zheng et al.
(Continued)

FOREIGN PATENT DOCUMENTS

CN 101751060 B 9/2013
WO 2013060802 A1 5/2013

OTHER PUBLICATIONS

Xiong, et al., "Online Estimation of Peak Power Capability of Li-Ion Batteries in Electric Vehicles by a Hardware-in-Loop Approach", In Journal of Energies, vol. 5, Issue 5, May 15, 2012, pp. 1455-1469.
(Continued)

*Primary Examiner* — Jaweed A Abbaszadeh
*Assistant Examiner* — Gayathri Sampath
(74) *Attorney, Agent, or Firm* — Rainier Patents, P.S.

(57) ABSTRACT

A dynamic peak power management system may prevent brownouts while improving performance and user experience compared to conventional techniques. A current threshold may be set below the maximum current capability (Imax) of a battery. If the current drawn from the battery exceeds the current threshold repeatedly, then system components may be throttled to decrease their peak power usage. If the current drawn from the battery stays below the current threshold for some time, then system components may be unthrottled to improve performance. This dynamic adaptable technique for managing peak power does not unnecessarily sacrifice performance by preemptively throttling system components to avoid the rare worst-case scenario where power spikes of system components perfectly align in time.

20 Claims, 12 Drawing Sheets

(51) Int. Cl.
    *G06F 1/30*     (2006.01)
    *G06F 1/3206*     (2019.01)
    *G06F 1/324*     (2019.01)
    *G06N 20/00*     (2019.01)
    *H03K 5/24*     (2006.01)

(56) References Cited

U.S. PATENT DOCUMENTS

| | | | |
|---|---|---|---|
| 9,652,026 | B2 | 5/2017 | Park et al. |
| 9,690,358 | B2 | 6/2017 | Jenne et al. |
| 10,283,987 | B1* | 5/2019 | Wang ................ H02J 7/00714 |
| 10,803,962 | B1 | 10/2020 | Tanaka |
| 2011/0148383 | A1 | 6/2011 | Mullen et al. |
| 2011/0314318 | A1* | 12/2011 | Sawai ................ G06F 11/2015 |
| | | | 713/340 |
| 2016/0070327 | A1* | 3/2016 | Nemani ................ G06F 1/3206 |
| | | | 713/300 |
| 2016/0091960 | A1* | 3/2016 | Ismail ................ G06F 1/3206 |
| | | | 713/320 |
| 2016/0282930 | A1* | 9/2016 | Ramachandran ..... G06F 1/3228 |
| 2017/0040895 | A1* | 2/2017 | May ................ G01R 19/165 |
| 2018/0309321 | A1 | 10/2018 | Montero et al. |
| 2019/0146569 | A1* | 5/2019 | Nge ................ G06F 1/305 |
| | | | 713/320 |
| 2019/0377395 | A1* | 12/2019 | Kaburlasos ............ G06F 1/3206 |
| 2020/0103953 | A1* | 4/2020 | Sadowski ............ G06N 20/00 |
| 2020/0264692 | A1 | 8/2020 | Gorbatov et al. |
| 2021/0124404 | A1 | 4/2021 | Mohammad et al. |
| 2021/0389353 | A1* | 12/2021 | Bhargava ................ G01R 31/40 |

OTHER PUBLICATIONS

"International Search Report and Written Opinion Issued in PCT Application No. PCT/US22/026090", Mailed Date: Aug. 8, 2022, 15 Pages.

* cited by examiner

| CPU Power Level | Maximum Power (W) |
|---|---|
| PL1 | 35 |
| PL2 | 64 |
| PL3 | 66 |
| PL4 | 121 |

FIG. 1A

| GPU Power State | Maximum Power (W) |
|---|---|
| P8 | 15 |
| P5 | 50 |
| P3 | 100 |
| P0 | 116 |

FIG. 1B

DYNAMIC PEAK POWER CONTROL

BACKGROUND

Electronics devices can consume varying amounts of power depending on their level of performance. That is, high performance devices consume more power. However, electrical power is a limited and costly resource. Thus, the desire for high performance needs to be balanced with the level of power consumption.

SUMMARY

The present concepts relate to peak power budgeting and control. An electronic device, which may include one or more electronic components, may consume power at varying levels. Thus, the source of electrical power may be configured to supply sufficient power to the device and all of its components while they operate concurrently without causing brownouts. Where the power source may not be able to supply sufficient power to meet the demands of one or more of the components that are operating at their peak power levels (or not necessarily their maximum peak power levels but high enough power levels to potentially cause a brownout), one or more of the components may be throttled to consume less power. Throttling can be achieved by, for example, eliminating, reducing, mitigating, and/or capping a component's power utilization.

The present concepts may use a current comparator to gain real-time visibility into the actual current power utilization and then appropriately throttle or unthrottle one or more components. This technique may be employed continuously to balance the goal of preventing brownouts with the desire to provide high performance for better user experience.

For example, in some implementations, hardware may be used to monitor power-related information and software may be used to throttle electronic components. The present concepts may implement a current threshold based at least in part on characteristics of a power source to sufficiently throttle, but not unnecessarily over-throttle, device components to improve performance and user experience.

BRIEF DESCRIPTION OF THE DRAWINGS

The detailed description below references accompanying figures. The use of similar reference numbers in different instances in the description and the figures may indicate similar or identical items. The example figures are not necessarily to scale.

FIGS. 1A and 1B show example maximum power utilizations levels of components.

DETAILED DESCRIPTION

Figure 2:
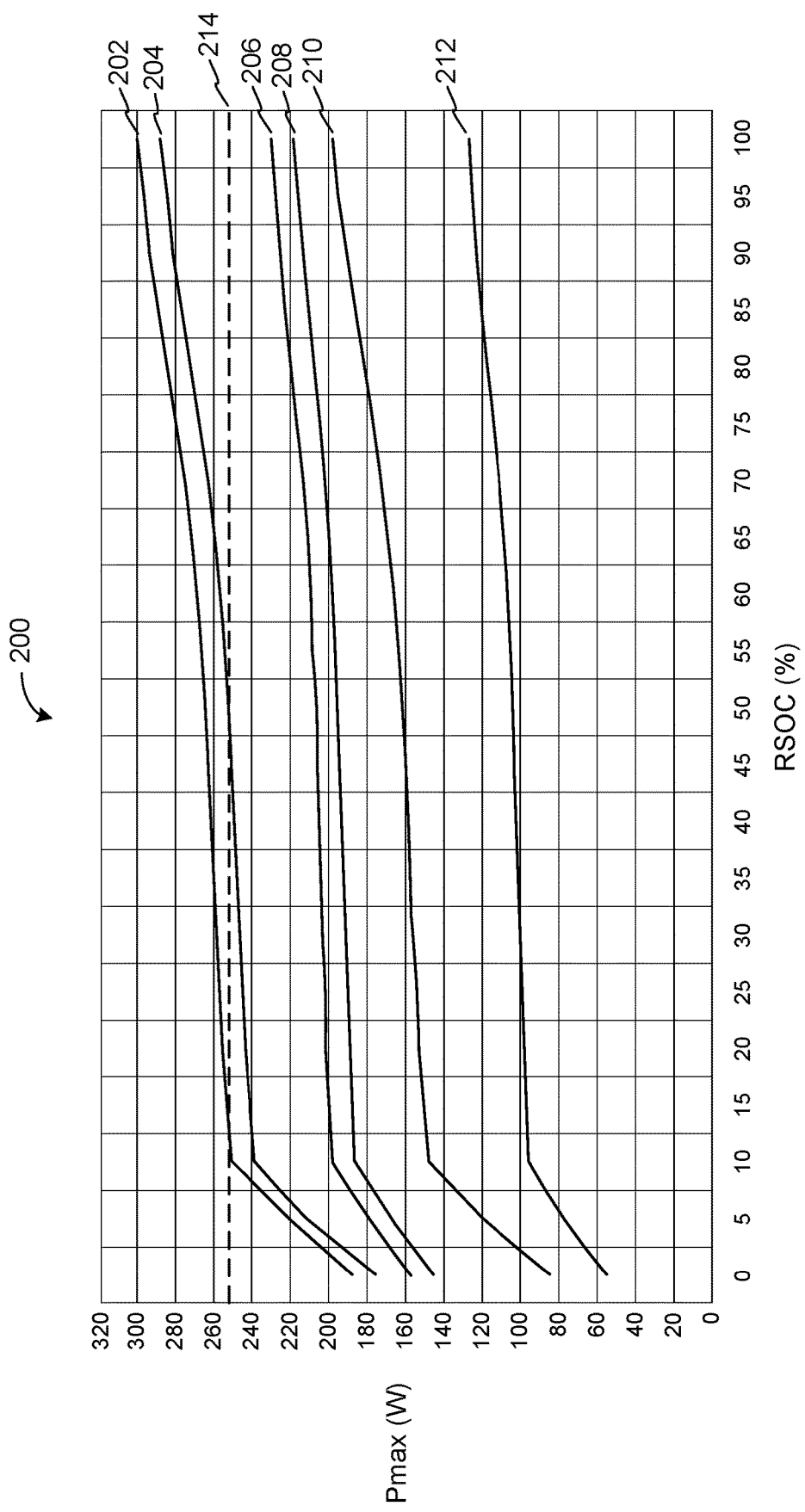
FIG. 2 shows an example graph of maximum power capabilities of power sources.

Newer electronic components, such as central processing units (CPUs) and graphics processing units (GPUs), are being designed to operate at higher peak power levels to meet the ever-increasing demand for increased performance. Conventional controls that are used to prevent brownouts overly limit performance. The present concepts can manage peak power in a way that the performance impact experienced by end users is less than conventional techniques.

FIGS. 1A and 1B show example maximum power utilizations levels of components. FIG. 1A shows that an example CPU may have at least four power modes (also called power levels or power states). The four power modes may represent successively increasing performance, e.g., operational frequency. Therefore, the maximum power usage for each of the four listed power modes may increase correspondingly. Specifically, in this example, the CPU may use as much as 35 watts (W) while operating in the lowest performance power level PL1, up to 64 W in PL2, 66 W in PL3, and the highest possible peak power of 121 W in the highest performance level PL4. These power wattage values may be provided by the CPU supplier and may have been obtained through empirical measurements.

FIG. 1B shows that an example GPU, such as a discrete GPU (DGPU), may have at least four power modes: P8, P5, P3, and P0. For this example GPU, P0 may be the power state that provides the most benefit to the user (i.e., the highest performance). For example, the P0 state may be used in gaming, for smoothest graphics, and in machine-learning applications where fastest training times are desired. The lower power states P3, P5, and P8 may be used for less graphics-intensive tasks, such as internet browsing or word processing. Therefore, the maximum power usage for the highest performance power state may be the highest among the plurality of power states. Specifically, in this example, the GPU power usage may peak up to 15 W in power state P8, 50 W in P5, 100 W in P3, and 116 W in P0.

Electronic components that consume power, such as the CPU and the GPU shown in FIGS. 1A and 1B, may be controlled to operate at certain performance levels or power modes. Throttling, consistent with the present concepts, may mean eliminating, reducing, or capping the power usage of a component. For instance, the CPU or the GPU may be throttled by changing its power state from a higher power consuming state to a lower power consuming state. Furthermore, the CPU or the GPU may be throttled by lowering its power consumption even within a particular power state, for example, by decreasing the core switching frequency. In one sense, all electronic components have multiple power states (at the very least: on and off), and therefore can be throttled. Unthrottling, consistent with the present concepts, can mean increasing power consumption, raising a power cap, removing any power cap, or undoing any throttling. For example, unthrottling the CPU or the GPU may involve changing its power state from a lower power state to a higher power state, permitting the component to switch to a higher power state than previously allowed, or increasing a cap on the core switching frequency within the current power state.

As processor technology advances to provide higher performance and meet ever-increasing demand for better user experience, the peak power levels of components (e.g., 121 W for the CPU's PL4 and 116 W for the GPU's P0) continue to increase over time, generation after generation. Although more advanced components can provide higher performance, they may consume more power than the available power source can supply and therefore cause brownouts.

An electronic device may include a power source. For example, the power source may include a battery and/or a power supply unit (PSU), such as an input to a battery charger. In some circumstances, the maximum power capability (Pmax) of the power source may not be able to supply sufficient power to all components inside the electronic device to run at their maximum or peak power consumption levels simultaneously. If a component reaches some high power spikes and draws too much power that the power source cannot handle, then the system voltage may drop too low and potentially cause the device to brownout. A brownout can cause negative behavior, including a crash. This problem is worsening over time as newer components have very high peak power specifications.

For these reasons, conventional devices often implement brownout controls. A conventional brownout control may involve first figuring out how much power is available from a power source for the duration (usually measured in milliseconds) of potential power spikes. This step may involve, for example, checking whether the PSU is plugged in and reading power-related parameters from the PSU and/or the battery. For example, a battery may report that it can supply 200 W of power for 50 ms.

Next, a conventional brownout control may preemptively limit the power consumption of one or more components in the device to prevent brownouts. For example, a maximum power cap may be set on a processor (e.g., a CPU or a GPU) to preemptively limit the magnitudes of the worst-case power spikes that the processor may generate. Such a cap would ensure that the power consumption by the processor stays within the amount of power available from the power source.

However, all of the available maximum power capability of the power source cannot be fully allocated to the processor alone, because the power source is being shared by multiple components in the device. That is, if the total peak power available from a battery is 100 W, the entire 100 W cannot be allocated to the processor alone, because there may be other power-consuming components that draw power from the same power source at the same time. Thus, if the total peak power available from the battery is 100 W and non-processor components have combined peak power of 15 W, for example, then the processor should be capped at 85 W (100 W minus 15 W). This may prevent the processor from reaching peaks above 85 W that could potentially cause the voltage to drop too low and cause a brownout.

Therefore, conventional peak power management techniques assume that various components all reach their peak power concurrently and then preemptively throttle the components in view of the worst-case scenario where all the components reach peak loads simultaneously. Such preemptive measures result in throttling too much and unnecessarily degrading performance.

FIG. 2 shows an example graph 200 of maximum power capabilities of power sources. In this graph 200, the y-axis represents the maximum power capability (Pmax) in watts, and the x-axis represents the relative state of charge (RSOC) of a battery ranging from 0% to 100%. In FIG. 2, a graph line 204 may represent Pmax of a fresh battery and a PSU, a graph line 208 may represent Pmax of an aged battery and a PSU, a graph line 210 may represent Pmax of a fresh battery, and a graph line 212 may represent Pmax of an aged battery. In these examples, the PSU may be a 95 W power source, and the aged battery may be about 3 years old. These graph lines of Pmax values may be provided by the battery gas gauge, for example.

As illustrated in FIG. 2, Pmax of the power source may depend on multiple factors. For example, Pmax may depend on RSOC of the battery. As the battery RSOC level increases, Pmax increases. Conversely, as the battery RSOC level decreases, Pmax decreases. Furthermore, Pmax of the battery may decrease with age. A fresh new battery may provide the highest Pmax, whereas an older battery may provide lower Pmax. Additionally, where the electronic device is unplugged and thus operating on battery power alone without the PSU, Pmax may be further reduced. Another factor that affects Pmax may include the temperature of the battery (not shown in FIG. 2)

The graph 200 includes an example burst power budget 214 of an example system that includes a CPU and a GPU. In one example scenario, the CPU may consume peak power of 121 W (e.g., the CPU in FIG. 1A), the GPU may consume peak power of 116 W (e.g., the GPU in FIG. 1B), and the rest of platform (ROP) may consume peak power of 15 W. Thus, a simple conventional technique may set the burst power budget 214 to be a total of 252 W (121 W+116 W+15 W), as shown in FIG. 2, by piling up the maximum power consumption levels of all components. Accordingly, in this example, the burst power budget 214 can be provided by a fresh battery with at least 50% charge and a 95 W PSU (as represented by the graph line 204). The other examples of power source that use an aged battery (i.e., the graph lines 208 and 212) or a fresh battery alone without a PSU (i.e., the graph line 210) will not be able to provide Pmax sufficiently high enough to meet the demands of the burst power budget 214, regardless of the RSOC of the battery, if the CPU, the GPU, and the ROP were to concurrently demand their full peak power levels.

In other configurations where the burst power budget 214 is lower than 252 W, throttling of components may be unnecessary with a fresh battery but become necessary as the battery ages over time. Or, throttling may be unnecessary when plugged in and using the PSU but necessary when unplugged and operating on battery alone.

Conventional techniques, therefore, read Pmax from the battery gas gauge, and then compare Pmax with the sum of all component peak power levels, according to their specifications. Then, if Pmax is less than the total peak power levels, then one or more components are throttled so that the power source can meet the total peak power levels and thus avoid potential brownouts. For example, if the peak maximum power capability is 200 W but the sum of the CPU peak power, GPU peak power, and ROP peak power is 252 W, then the CPU, the GPU, and/or other components may need to be throttled to avoid brownouts. Throttling components may limit performance and/or computing capabilities. The degraded performance may be noticeable to the user. For example, display frame rate, display resolution, or processing times may degrade and provide unsatisfactory experience to the user.

Figure 3:
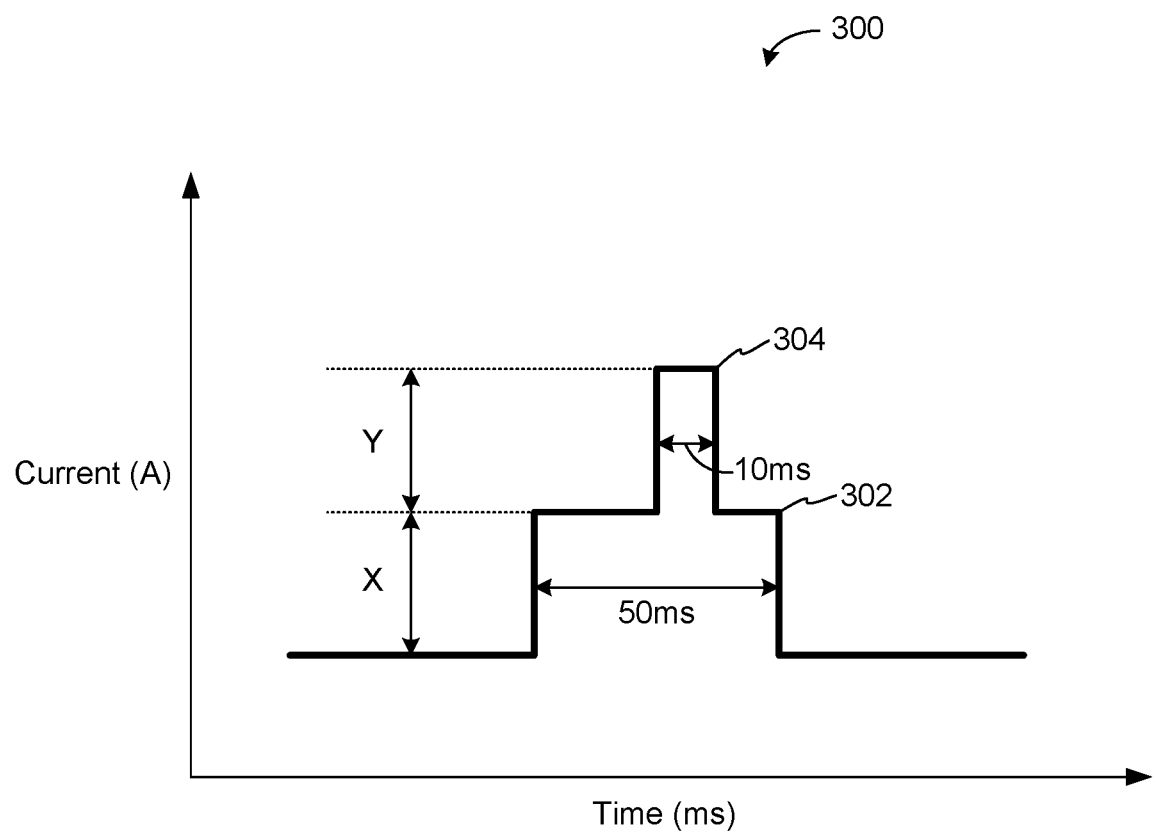
FIG. 3 shows an example peak power graph.

FIG. 3 shows an example peak power graph 300. In this simplified example, the peak power graph 300 shows that a GPU has a peak spike 302 of X amperes (A or amps) lasting 50 ms and that a CPU has a peak spike 304 of Y amps lasting 10 ms. A conventional peak power management technique would simply combine (i.e., stack or pile up) the two peaks and budget X+Y amperes for both the GPU and the CPU. And if the power source cannot supply X+Y amps (X+Y>Pmax) for the duration of the peak spikes (50 ms in this example), then the GPU and/or the CPU would be preemptively throttled so the sum of the GPU's throttled peak spike of X' amps and the CPU's throttled peak spike of Y' amps would not exceed the power source's maximum power capability (X'+Y'<Pmax). Therefore, conventional peak power management techniques budget available power by assuming overlapping coincidence of the GPU peak spike 302 and the CPU peak spike 304.

For example, the CPU may be throttled to operate in PL1, PL2, or PL3 power states but prevented from operating in PL4 power state, so that the peak power usage would be capped at 66 W. Alternatively, the CPU may be throttled by capping its switching frequency so that the maximum power consumption in PL4 power state is less than 121 W (e.g., 100 W). Similarly, the GPU may be capped to operate in P5 or P8 power state but prevented from operating in P0 or P3 power state, so that the peak power usage would be capped at 50 W. Alternatively, the GPU may be throttled by capping its switching frequency so that, even in P3 power state, the maximum power consumption stays below 75 W, for example, instead of 100 W. Thus, throttling the power consumption can be achieved even while the CPU or the GPU remains in a high power state.

The conventional technique preemptively throttles one or more components assuming that all components will consume their respective maximum power levels all at the same time. Thus, conventional techniques can result in unnecessary over-throttling if the multiple components never or rarely ever consume their maximum power levels concurrently.

To illustrate another example of conventional peak power control techniques, two universal serial bus (USB) peripherals may be plugged into the device. For instance, a mobile phone and a headset, both of which may be USB-C peripherals, may be plugged into and charging from the device. According to conventional techniques, the device may reserve, for example, 25 W for those two USB-C peripherals. Additionally, a CPU may use up to 100 W, so the device may further reserve 100 W for the CPU. Also, a GPU may use up to 100 W as well, so the device may reserve another 100 W for the GPU. Thus, in total, 225 W would need to be reserved if the USBs, the CPU, and the GPU all consume maximum power all at the same time. However, if the power source can only supply 150 W of power, then a conventional technique would preemptively throttle, for example, the CPU and the GPU. And then, if a user plugs in another USB device that could peak as high as 7 W, the CPU and/or the GPU may need to the preemptively throttled even more to stay under the 150 W budget.

The downside of such conventional techniques is that the assumption of concurrent peak spikes may be overly conservative. That is, the device may never actually use 225 W of power if the USB-C, the CPU, and the GPU do not reach their peak spikes in an overlapping time period.

Even though the device may reserve 25 W for the USBs, the actual power use by the two USB-C peripherals may be much less than 25 W most of the time. Although there may be some brief periods of spikes up to 25 W (e.g., at loading time), most of the time, the actual power consumption tends to be less much than 25 W. Similarly, although the power consumed by the CPU or the GPU could spike up to 100 W in sharp momentary spikes, the actual use may be a lot less than 100 W most of the time.

Documentary specifications of components often provide the worst-case peak power levels. But, in reality, the device may not see 225 W power usage from the combination of the USBs, the CPU, and the GPU, because the momentary spikes from all components rarely align perfectly, if ever. That is, the CPU and the GPU may peak at different, non-overlapping time periods.

Therefore, in actual use, the combined power consumption by the USBs, the CPU, and the GPU may spike up to only about 100 W or so, for example, in total. The problem with conventional techniques is over-throttling the components according to the worst possible case, which may not actually happen in reality. Since the conventional techniques do not have visibility at any given time into how much power the components are pulling or asking for, conventional techniques safely throttle the components by capping their peak power to levels that will always stay below the peak power budget. These conventional techniques thus require constant throttling of the components even when they do not need to be throttled.

The conventional techniques sacrifice performance too much by preemptively capping the power consumption of components based on the assumption that peak power spikes for multiple components may perfectly align in time and their power consumption levels will pile up to their sum total. This assumption presupposes that peak power of a plurality of components (e.g., the GPU, the CPU, and other components) would stack and aggregate to a very high total power consumption level. But, since conventional techniques do not actually measure live power consumption, there is no visibility into actual power use of the various components nor the timing of power spikes from multiple components. Conventional methods simply take the maximum possible power consumption values according to the specifications and preemptively throttle accordingly. Therefore, in practice, the conventional techniques end up calculating an overly reserved power budget and unnecessarily decreasing performance to avoid theoretical maximum power levels, which may never be actually reached.

Another shortcoming of the conventional peak power management techniques is that they fail to account for a voltage regulator (VR) input filter. Even if the CPU power use steeply spikes up momentarily to a certain peak power value on the output side, the corresponding spike indicating current pulled from the battery on the input side may not be so drastic due to the VR filter. Thus, capping the CPU power consumption based on the CPU's potential power spike levels rather than the actual power demand seen on the battery side results in even more unnecessary capping and overly conservative budgeting.

In view of the disadvantages of the conventional techniques, there is a need for better management of peak power consumptions while providing high performance and satisfactory user experience. Users continue to demand higher performance, so electronic components, such as CPUs and GPUs, are being made with higher peak power to meet those demands. Although avoiding brownouts is important, limiting performance too aggressively underutilizes the performance potential of high-end components and provides the user unsatisfactory experience. Conventional techniques of preemptively throttling may have been a satisfactory solution when the difference between normal power modes and peak power modes was not much. But now, the difference is very high, so preemptive throttling sacrifices too much performance for the remote possibility that the peak power spikes of various components will all line up in time and cause brownouts.

The present concepts relate to dynamic peak power management and control that provide improved performance over conventional techniques while still avoiding brownouts. Rather than setting a fixed throttle and fixed performance for electronic components, the present concepts can dynamically vary the throttle and performance, adapting to the changing power demands of the device and its components.

Consistent with some implementations of the present concepts, one or more current comparators may be introduced to provide real-time visibility to the actual power use of the device. Therefore, a system power manager may react by throttling components according to the live current power usage rather than preemptively reserving the maximum peak power possible for all components combined.

The current comparators may use the maximum current capability (Imax) from the battery gas gauge to implement one or more current thresholds. The signals from the comparators may be used to throttle one or more components in a smart way such that performance is not limited unnecessarily when there is no peak spike event. The comparators thus may allow detection of power spikes as they occur live. Therefore, components may be permitted to operate without performance limitations until the comparators toggle to initiate throttling. Moreover, throttling may be applied intelligently and gradually to maintain optimal performance rather than over-throttling at the sacrifice of performance. For example, machine-learning algorithms may be used to determine whether, when, and/or by how much to throttle as well as which components to throttle. Thus, the present concepts can implement improved peak power budgeting, because throttling may be applied as necessary under the current power conditions, and thereby avoid unnecessary performance waste and improve user experience. The present concepts may implement peak power control using comparators that can monitor live power usage and actual detected peak power events rather than preemptively throttling components based on concurrent piling up of their documentary specifications of theoretical maximums.

Figure 4:
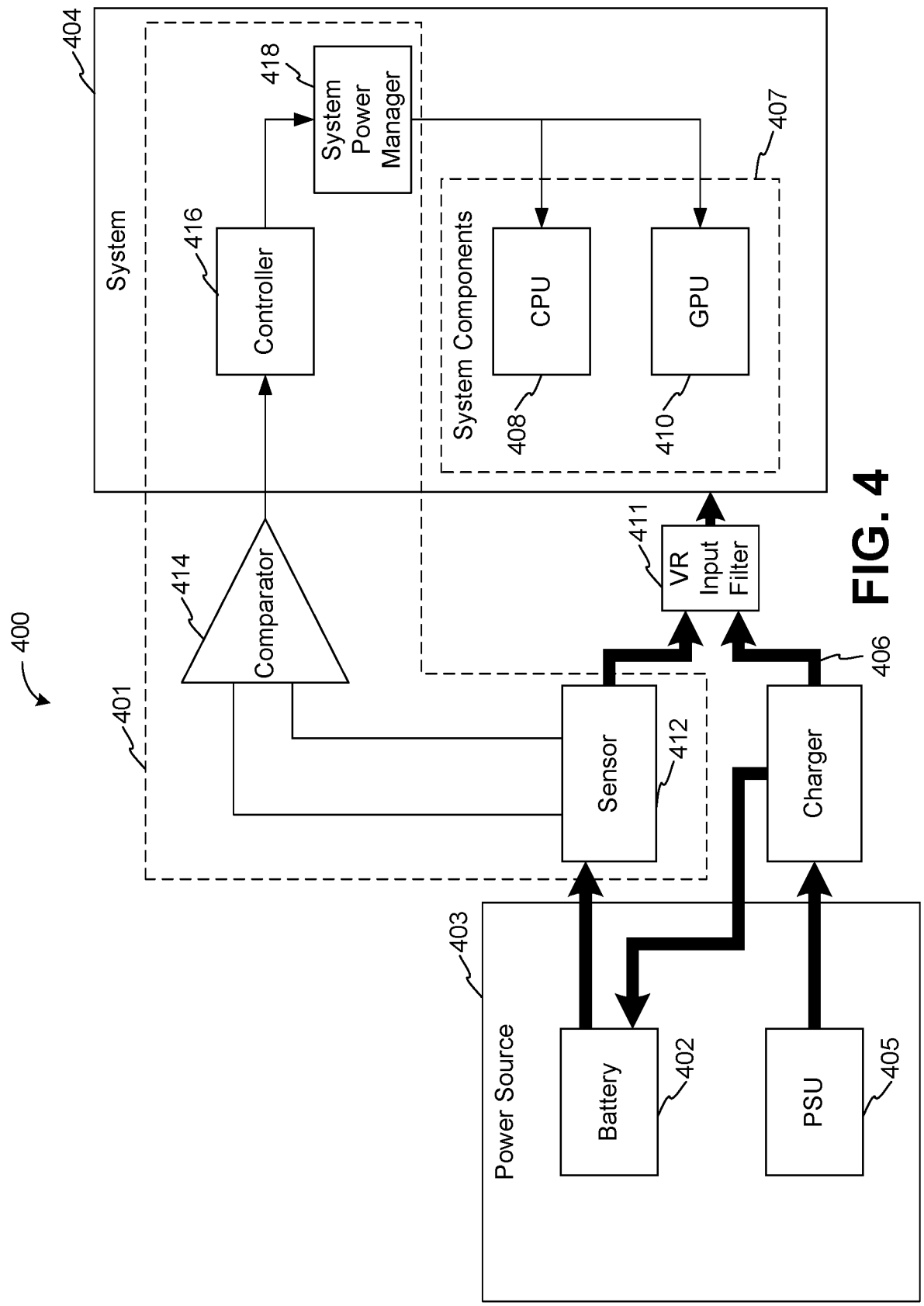
FIG. 4 shows a block diagram of an example dynamic peak power control system, consistent with some implementations of the present concepts.

FIG. 4 shows a block diagram of an electronic device 400 that includes an example dynamic peak power control system 401, consistent with some implementations of the present concepts. In this example implementation, the electronic device 400 may include a power source 403, such as a battery 402 and/or a PSU 405. The electronic device 400 may include a system 404 of components. In one implementation, the system 404 may include a printed circuit board (PCB) (e.g., a motherboard), and one or more of the components may be on the PCB. When the PSU 405 is plugged in (e.g., to an AC power source), the PSU 405 may power a charger 407, which may supply power to the system 404 and/or supply power to the battery 402 to charge it. When the PSU 405 is plugged in, the system 404 may be powered by the charger 407 and, if necessary, may be supplementally powered by the battery 402 as well. When the PSU 405 is not plugged in, the system 404 may be powered by the battery 402 alone.

The battery 402 may provide power to the system 404 via a power supply line 406 that represents an energy delivery path from the battery 402 to the system 404. The power supply line 406 may be a wire or a connector. The power supply line 406 may supply power to one or more power rails on the PCB that are connected to the components in the system 404.

The system 404 may include one or more system components 407 that consume power from the battery 402. These system components 407 may simply operate in an off power state (consuming zero power) or operate in an on power state. Alternatively, one or more of the system components 407 may have multiple power states with varying power consumption levels, similar to the CPU and the GPU described in connection with FIGS. 1A and 1B. Furthermore, the system components 407 may be controlled to operate in certain power states and/or operate in certain frequencies, for example, by throttling or unthrottling their performance and their power consumption. For simplicity, the system components 407 in FIG. 4 may include a CPU 408 and a GPU 410. However, the system 404 may include many more components. The CPU 408 and the GPU 410 may include multiple power states, such as the CPU and the GPU described in FIGS. 1A and 1B.

Consistent with some implementations of the present concepts, the dynamic peak power control system 401 may be implemented in hardware, software, or a combination. The dynamic peak power control system 401, in this example shown in FIG. 4, may include a sensor 412 for sensing the actual level of power being drawn from the battery 402 by the system 404. In one implementation, the sensor 412 may include a current sense resistor (also called a shunt resistor). The sensor 412 may be positioned along the power supply line 406 near the battery 402 to measure the current being pulled out of the battery 402 on the input side, which may be different from the current being drawn into the system components 407 in the system 404 on the output side. That is, peak power may be cut and filtered out by a VR input filter 411. Although FIG. 4 shows one VR input filter 411 for simplicity, the VR input filter 411 may represent a separate input filter and a separate voltage regulator. Further, although FIG. 4 shows only one VR input filter 411 for simplicity, the electronic device 400 may include a separate VR input filter (e.g., a combination of an input filter and a voltage regulator) for individual system components 407 (e.g., the CPU 408 and the GPU 410). Thus, a sharp drastic power spike on the output side may only exhibit as a relatively moderate power spike on the input side. Thus, the present concepts may measure and monitor current spikes on the input side by the battery 402, which may be what matters for power budgeting using the battery 402 as the power source 403. The position of the sensor 412 may measure the actual total current draw from the system 404, factoring in the VR input filter 411 and reflecting the actual conversion stage efficiency.

The dynamic peak power control system 401 may include a comparator 414 for implementing a threshold to compare the power draw sensed by the sensor 412. Although FIG. 4 illustrates only one comparator 414, the dynamic peak power control system 401 may include a plurality of comparators. In some implementations, the comparator 414 may include a current comparator, which may compare the current level detected across the sensor 412 against a current threshold (Ith). The current threshold Ith may be set to a fixed current value or set in relation to the maximum current capability (Imax) of the battery 402. Thus, the comparator 414 may detect actual current spike occurrences while the electronic device 400 is in use. Although FIG. 4 shows only one comparator, additional comparators may be added in parallel to implement additional thresholds (e.g., Ith1, Ith2, Ith3, Ith4, and so on). Example multi-threshold implementations will be explained below.

These implementations are examples of the present concepts. Other implementations are possible. For example, the sensor 412 and the comparator 414 may be implemented as a fully integrated application-specific integrated circuit (ASIC) semiconductor. They do not need to be discrete components, such as an external resistor. As alternative examples, the current sense may be implemented as integrated resistor (R) sense in an ASIC, integrated field-effect transistor (FET) sense in an ASIC, integrated sense amplifier, or any other way to sense current.

The dynamic peak power control system 401 may include a controller 416, such as a signal aggregation module or a signal acquisition module (SAM). In some implementations, the SAM may an embedded microcontroller on the PCB. The comparator 414 may output an alert signal to the controller 416 indicating that the measured current from the sensor 412 exceeds the current threshold Ith. In one implementation, the comparator 414 may output a high signal when the current threshold Ith is exceeded and output a low signal when the current threshold Ith is not exceeded. Alternatively, a low output signal may represent an alert of the sensed current exceeding the current threshold Ith. In some implementations, the controller 416 may also keep track of timing information associated with the power spikes, such as amplitudes, frequencies, durations, and/or intervals. The comparator 414 may be fast enough (e.g., within a few microsecond range) to quickly detect power spike events in real time and send information to the controller 416. For example, the comparator 414 may be a current sense amplifier with a comparator.

The controller 416 may receive the signals from the comparator 414 regarding the current being drawn from the battery 402. In one implementation, the controller 416 may manage a counter whose value depends on one or more factors including, for example, power peak occurrences where the current measured by the comparator 414 exceeds the current threshold Ith. For example, the controller 416 may sample the signal from the comparator 414 at regular intervals. The counter value may be increased each time the measured current exceeds the current threshold Ith and decreased each time the measured current is below the current threshold Ith. Thus, the counter value may be based on at least the number of times and the duration during which the signal from the comparator 414 exceeds the current threshold Ith. Other implementations for the counter are possible.

The dynamic peak power control system 401 may include a system power manager 418, such as a system management framework (SMF). In some implementations, the controller 416 may transmit information about power spikes to the system power manager 418. For example, the controller 416 may send the counts of power spikes and/or the timing of the power spikes to the system power manager 418.

The system power manager 418 may receive information from the controller 416 about the measured current in relation to the current threshold Ith. The received information may indicate that, for example, the power usage by the system 404 is well below the maximum current capability (Imax) of the battery 402, getting close to reaching the Imax, and/or in danger of causing a brownout. In response, the system power manager 418 may react by throttling or unthrottling one or more of the system components 407 in the system 404, such as the CPU 408 and/or the GPU 410.

In some examples of the present concepts, the system power manager 418 may be implemented in software to change the power consumption of one or more system components 407. The system power manager 418 may communicate with the controller 416, the CPU 408, the GPU 410, and other system components 407 through drivers. If the comparator 414 is detecting an actual power spike, then the system power manager 418 may throttle the system 404. For example, the system power manager 418 may switch the CPU 408 and/or the GPU 410 into lower power states, such as switching the CPU 408 from power state PL4 to power state PL3 and/or switching the GPU 410 from power state P0 to power state P3. As another example, the system power manager 418 may lower the switching frequency of the CPU 408 and/or the GPU 410 while maintaining their power states, such as reducing the maximum power consumption of the CPU 408 in power state PL4 from 121 W to 80 W and/or reducing the maximum power consumption of the GPU 410 in power state P0 from 116 W to 70 W. Such throttling may degrade performance but may help avoid a brownout. If the controller 416 reports that there have not been power spikes, then the system power manager 418 may unthrottle the system 404, for example, by switching the CPU 408 and/or the GPU 410 into higher power states. Such unthrottling may allow the system 404 to operate at higher performance to provide better user experience.

The system power manager 418 may also throttle or unthrottle the system 404 by turning the system components 407 on or off. For example, the system 404 may include four network interface cards (NICs) that are operating in parallel and load-balanced. Even if the NICs do not have multiple power modes, the system power manager 418 may throttle the NICs by turning off one or more of the four NICs so that fewer than all four NICs are operational, thereby reducing the total power consumption of the four NICs.

The implementations described in connection with FIG. 4 are examples. There are many different possible ways to implement the present concepts. The power source 403 may be a PSU alone, a battery alone, a combination of a PSU and a battery, or any other source of power. The system power manager 418 may receive current power usage information directly from the power-consuming components, directly from the power source itself, or any other means. The comparator 414 may be implemented in software through programming rather than through a hardware comparator. The system power manager 418 may receive numerical values relating to power (e.g., current values, voltage values, power values, and/or time values). The elements of the dynamic peak power control system 401, including the sensor 412, the comparator 414, the controller 416, and the system power manager 418, may each be implemented in software, hardware, or a combination. In one implementation, the dynamic peak power control system 401 (including the sensor 412, the comparator 414, the controller 416, and the system power manager 418) may be implemented in an integrated ASIC semiconductor that includes static or dynamic random access memory (SRAM or DRAM) where firmware and/or software algorithms (including machine-learning algorithms) can be flashed into.

Figure 5:
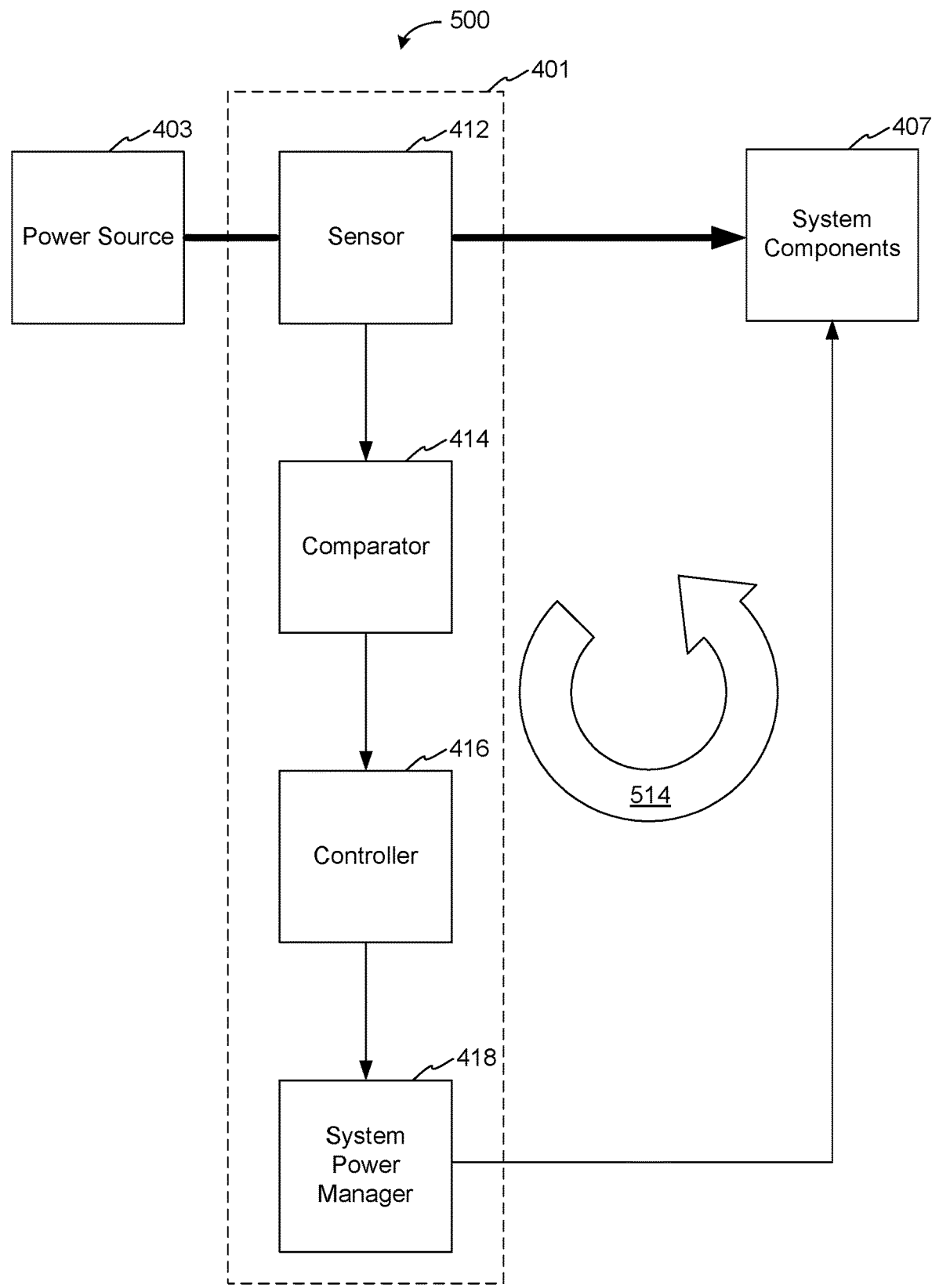
FIG. 5 shows a conceptual diagram of an example dynamic peak power control system, consistent with some implementations of the present concepts.

FIG. 5 shows a conceptual diagram 500 of the dynamic peak power control system 401, consistent with some implementations of the present concepts. This conceptual diagram 500 may illustrate the operations of the dynamic peak power control system 401 at a logical level.

The dynamic peak power control system 401 may include the power source 403 that feeds power to the system components 407. For example, the power source 403 may include the battery 402, and the system components 407 may include the CPU 408 and the GPU 410.

The dynamic peak power control system 401 may include the sensor 412 on a power supply line (i.e., in the power feed path) from the power source 403 to the system components 407. The sensor 412 may measure the power being output from the power source 403. Power may be measured by measuring other parameters that relate to power, such as current. In one implementation, the sensor 412 may include a shunt resistor that enables the current output from the power source 403 to be measured as a voltage difference across the shunt resistor by a comparator 414 (such as a current comparator).

The comparator 414 may compare the power output by the power source 403 against a power threshold. In one implementation, the comparator 414 may implement a current threshold and output a signal that indicates whether the measured current from the power source 403 crosses the current threshold. For example, the comparator 414 may output a high signal or a low signal (i.e., binary signals) depending on whether the current threshold is exceeded. The comparator 414 may output signals to the controller 416. The output signals may alert the controller 416 that the threshold has been exceeded.

The controller 416 may receive the binary signals from the comparator 414 and convert them into data values that can be fed as feedback into and interpreted by the system power manager 418. For example, the controller 416 may manage a counter whose value that is incremented or decremented in response to the signals from the comparator 414. In one example implementation, the controller 416 may use an exponential moving average to create the data values for the system power manager 418. The data values may indicate the degree to which the measured current is above the current threshold on average.

The system power manager 418 may implement power control of the system components 407 based at least in part on the data values from the controller 416. Unlike conventional techniques that preemptively reserve power for the highest possible power peaks of multiple components all occurring simultaneously, the system power manager 418 controls the peak power of the system components 407 in reaction to actual power draw from the power source 403 as a result of live power consumption by the system components 407, as indicated by signals received from the controller 416.

The system power manager 418 may be implemented in hardware and/or software, such as the SMF. The system power manager 418 may balance two competing goals. On the one hand, the system power manager 418 may throttle the peak power usage by the system components 407 so that they do not draw too much power from the power source 403 and cause brownouts. On the other hand, the system power manager 418 may unthrottle the system components 407 so that they operate at high levels of performance and provide satisfactory user experience. The system power manager 418 may balance these two competing interests in one or more rounds of throttle adjustments and may reach an equilibrium.

The system power manager 418 may gather and/or receive available information. For instance, the system power manager 418 may determine how much power is available from the power source 403. The system power manager 418 may receive data values indicating how much power is being consumed by the system components 407. The system power manager 418 may have information on the power states of the system components 407.

The system power manager 418 may use a configurable algorithm pipeline to calculate appropriate throttling limitations and control the performance of the system components 407. For example, the system power manager 418 may be programmed to control power, current, and/or frequency associated with the system components 407, depending on what controls are available on the system components 407. The system power manager 418 may set power caps for the system components 407 and/or may slow down the frequency at which the system components 407 are functioning. These controls may prevent the magnitudes of power spikes from being too high and causing brownouts.

In some implementations, the system power manager 418 may initialize the system components 407 with no performance limitations (i.e., no throttles). As the power usage by the system components 407 surpass the current threshold, the system power manager 418 may begin throttling the system components 407. In alternative implementations, conventional preemptive caps based on concurrent specification power peaks of the system components 407 may be used as a starting point. As the actual power usage by the system components 407 stay below the current threshold, the system power manager 418 may unthrottle the system components 407. In other implementations, the starting throttle level may be dependent on the state of the power source 403, such as the battery charge level (i.e., RSOC), Pmax, and/or Imax. After the initial setup, as the controller 416 detects more occurrence of the comparator 414 triggering alerts that the power usage by the system components 407 exceeds the threshold, the system power manager 418 may throttle the peak workload in the system components 407 more aggressively. Conversely, as the controller 416 detects that the power usage by the system components 407 are not exceeding the threshold, the system power manager 418 may release the throttle to increase performance.

The system power manager 418 may use a smart learning algorithm based upon occurrences of power peaks, power states of specific system components 407, and/or use of specific software applications. For example, the smart learning algorithm of the system power manager 418 may gradually step down the peak power workloads until the point at which the comparator 414 no longer toggles alert signals due to high-peak power-hungry applications. And then, the smart learning algorithm may turn back to full peak power workload when the smart learning algorithm learns which applications are safe and unlikely to cause brownouts.

The system power manager 418 may use interrupt signals generated by the comparator 414 with a timer to recognize a peak current condition. This condition may be filtered so that throttle activation can be performed very fast, whereas releasing the throttled state can be slowed down, thereby forming effectively a debounce filter. Once the system power manager 418 detects the peak power condition, it may start mitigating the performance of the system components 407 by gradually lowering the power usage of the system components 407. Thus, the system power manager 418 may avoid very fast throttling actions that may be very apparent to the user. The system power manager 418 may increase the performance mitigations (i.e., turn up the throttle) until the overload indication is no longer present. As the overload indication is absent for a prolonged period of time, the system power manager 418 may release the mitigation (i.e., turn down the throttle) to try to reach a non-mitigated state. Accordingly, the system power manager 418 may exhibit multiple behaviors: (1) peak mitigation that starts rapidly and is released fully very fast, or (2) peak mitigation that starts very fast and finds a steady state in which mitigation continues for an extended time due to the presence of high load detected by the comparator 414. Once the high load has passed (e.g., power-hungry applications stopped running), the system power manager 418 may lift some or all performance mitigations.

As illustrated in FIG. 5, the dynamic peak power control system 401 may form a feedback loop 514. This feedback loop 514 may enable the dynamic peak power control system 401 to automatically find a balance between power feed capability and system performance. The dynamic peak power control system 401 may allow the system components 407 to run without performance limitations until the comparator 414 toggles on, which would cause the system power manager 418 to start throttling the system Pmax budget gradually. These techniques may ensure improved Pmax budgeting because throttling may kick in as appropriate under current power usage and given limited energy resources. This feedback loop 514 can adaptively react in real time to many live factors, such as changing power or current capabilities of the power source 403, changing power characteristics of the system components 407 over time, different applications being used, etc. Therefore, the present concepts can avoid unnecessary performance throttling and improve user experience compared to conventional techniques.

Figure 6:
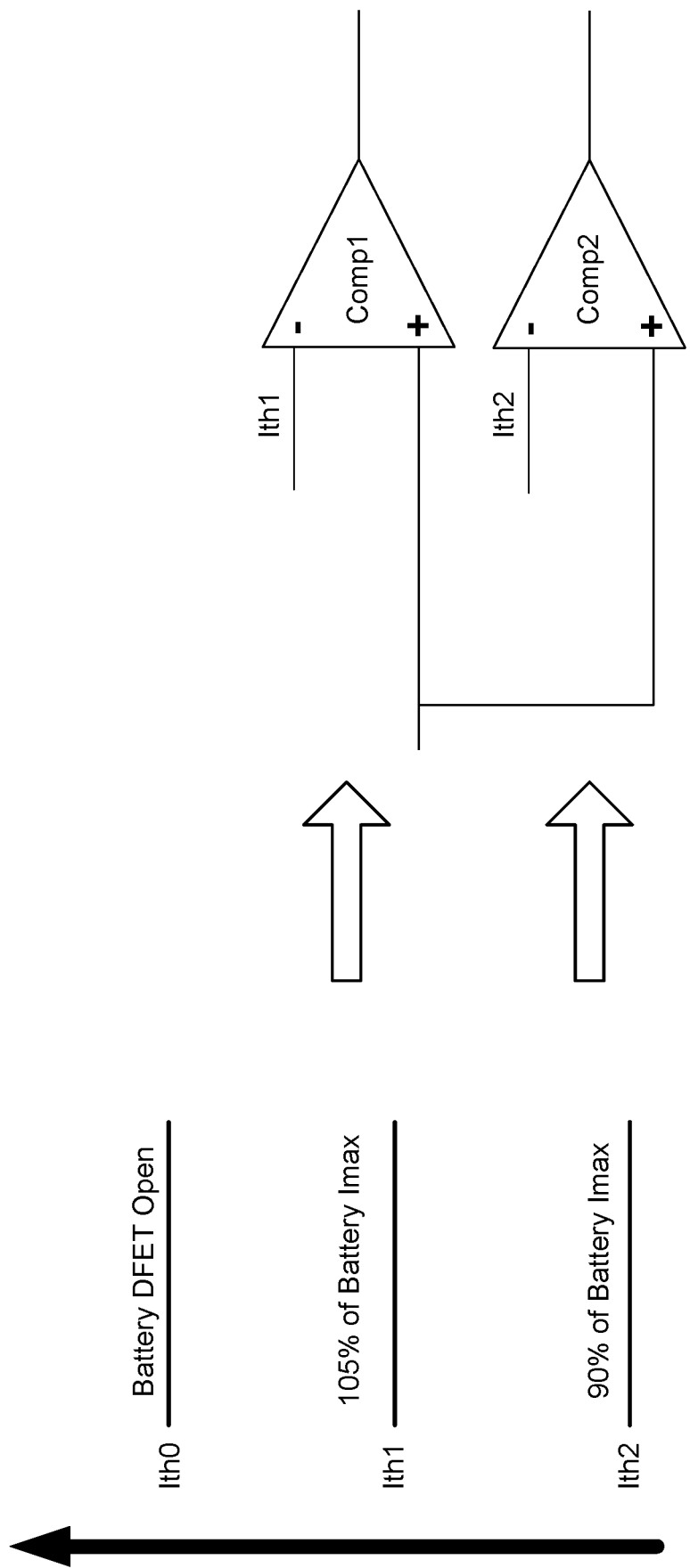
FIG. 6 shows an example implementation of thresholds, consistent with the present concepts.

FIG. 6 shows an example implementation of thresholds, consistent with the present concepts. In this example implementation, one or more current thresholds may be implemented in a device. For example, the device may include a battery discharge field effect transistor (DFET) open threshold as current threshold 0 (Ith0). Ith0 may serve as a safety function to isolate the battery from the load or a charger in errant conditions. When a discharge overcurrent condition is detected above Ith0, then a DFET may be opened or turned off to protect the battery. This battery protection feature may be implemented in the battery gas gauge.

The device may additionally include a charger discharge protection threshold as current threshold 1 (Ith1). For example, Ith1 may be set at 105% of the battery's maximum current capability (Imax), but other threshold levels are possible. For example, if the battery Imax is 20A, then Ith1 may be set to 21A. If Ith1 is exceeded, then a processor hot (PROCHOT) signal may be sent to a processor (e.g., a CPU or a GPU) to significantly throttle the processor. PROCHOT may be a feature implemented in a processor to quickly and drastically cut down performance to cool the processor when its temperature gets too hot. This feature may also be used to prevent brownouts when peak power rises too high.

If current rises and voltage drops below a certain level, the PROCHOT pin on the processor may be pulled, which may immediately bring the processor down to the lowest frequency and/or the lowest voltage state, for example. Although the processor can be bought down to a really low power state within an extremely short period of time using the PROCHOT feature, such an action would be very undesirable to the user in terms of performance and experience. The present concepts can attempt to avoid triggering PROCHOT so that the current level does not reach Ith1.

In one implementation, low voltage detection hardware circuitry may exist in the charger integrated circuit (IC) area on the PCB. The PROCHOT signal may come from the charger IC. In an alternative implementation, Ith1 may be implemented using a current comparator Comp1, as shown in FIG. 6. Comparator Comp1 may be implemented in the charger.

Consistent with some example implementations of the present concepts, the device may include current threshold 2 (Ith2). Ith2 may be programmable in hardware and/or software. For instance, an additional current comparator Comp2 configured in parallel to Comp1, as shown in FIG. 6, may implement Ith2. Comparator Comp2 in FIG. 6 may be the comparator 414 in FIG. 4. In one example implementation, Ith2 may be set at 90% of the battery Imax. For example, if the battery Imax is 20A, then Ith2 may be set at 18A. Another way to view this threshold is that, if the power source maximum power capability is 200 W, then the threshold can be 180 W (90% of 200 W). The 90% threshold may be a design choice set by the designer and may be modifiable, for example, 80% or 70%, or any other value. Moreover, additional current thresholds (e.g., Ith3, Ith4, . . . , IthN) may be implemented by configuring multiple current comparators in parallel with each current comparator comparing the measured current to a different current threshold. The designer may choose the number of thresholds and the current values of the thresholds depending on the information desired. A high threshold value, such as 90% of Imax, may alert the system power manager 418 that power peaks are very close to reaching Imax. A low threshold value, such as 50%, may alert the system power manager 418 that power usage is far from Imax. Additional thresholds, such as 70% and/or 80%, may give the system power manager 418 advance warnings of rising power usage as it approaches Imax.

A current threshold (e.g., Ith2) or multiple thresholds (e.g., Ith2, Ith3, and Ith4) may be set high or low depending on how early or late the designer wants to sound the alarm. For instance, if a current threshold is set low at 50% of battery Imax, the system power manager 418 could start gradually throttling early and safely avoid brownouts. If a current threshold is set high, for example, at 95% of battery Imax, there is greater chance that the system power manager 418 may react too late, fail to prevent brownouts, and fail to prevent PROCHOT triggers. Although performance may be better than setting a lower threshold, these fallouts would create an undesirable user experience.

In one implementation, Ith2 may be set at 90% of Imax, so that there is a 15% buffer (the difference between Ith1 at 105% of Imax and Ith2 at 90% of Imax) for the system power manager 418 to throttle system components 407 before PROCHOT is triggered. Thus, Ith1 for PROCHOT may be considered a backup protection in case Ith2 for the dynamic peak power control system 401 fails to manage the peak power spikes.

Conventional devices may implement Ith0 (battery DFET open) and/or Ith1 (PROCHOT) above the battery Imax to either drastically throttle system components or disconnect the battery altogether when these thresholds are triggered. However, the present concepts may implement Ith2 or additional thresholds below the battery Imax to gain early insight into potentially rising power usage before drastic measures become necessary. Thus, live visibility into the actual current draw may enable early and gradual throttling actions to prevent brownouts, avoid having to take drastic measures that would negatively impact user experience, and provide high performance when throttling is unnecessary. These technical advantages may be achieved by ongoing balancing of throttling and unthrottling of the system components in response to real-time current readings.

Figure 7:
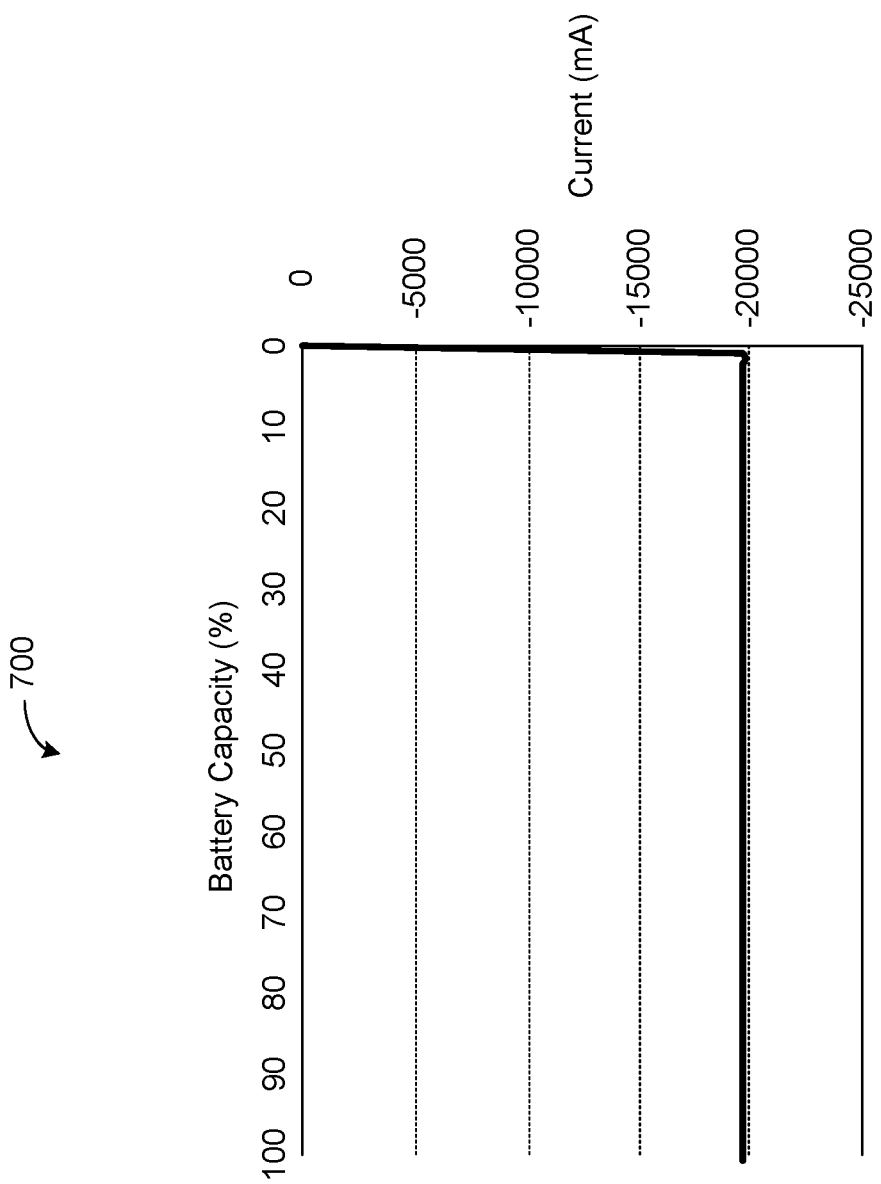
FIG. 7 shows a graph of peak power of an example power source.

FIG. 7 shows a graph 700 of peak power of an example power source. In this case, the y-axis represents current in ampere units, and the x-axis represents a battery charge capacity, e.g., RSOC, in percentage units. The graph 700 shows the maximum current capability (Imax) of an example battery power source at various battery RSOC levels. The Imax values may be read by the controller 416 from the battery gas gauge in the battery IC. In some implementations of the present concepts, an Imax profile of a battery, such as the graph 700, may be determined in order to set the current threshold (e.g., Ith2).

The graph 700 may reflect Imax of an example three-cell (3S) battery system with a voltage range of 9V to 14V. As shown in FIG. 7, the Imax profile is relatively flat and constant across almost the entire RSOC range except below around 3%. The Imax profile may also be almost independent of the temperature of the battery. Therefore, a current comparator, consistent with the present concepts, can be implemented with a constant current threshold. For instance, in the example implementation shown in FIG. 7, Imax is around 20A all the way from 100% to about 3% RSOC. Thus, Ith2 may be set as a constant threshold, for example, a 90% threshold at 18A to monitor in real time when the actual current peaks exceed Ith2 and is about to reach Imax. This is another advantage of the present concepts that use a current threshold over conventional techniques that use other parameters to implement a threshold where the other parameters may not be as constant as the current profile. For example, as shown in FIG. 2, Pmax profile may vary depending on RSOC and thus not as flat as Imax profile. Thus, conventional techniques that rely on the power profile may not be able to set a constant threshold.

If actual current peaks exceed Ith2, then power consumption may be throttled. In some implementations, this threshold may be set in hardware by a current comparator. The change in Imax below 3% may not be a concern since the device may already be configured to reduce power consumption or even eliminate power consumption (e.g., via idling, hibernating, or shutting down) at or before 3% RSOC.

Figure 8A:
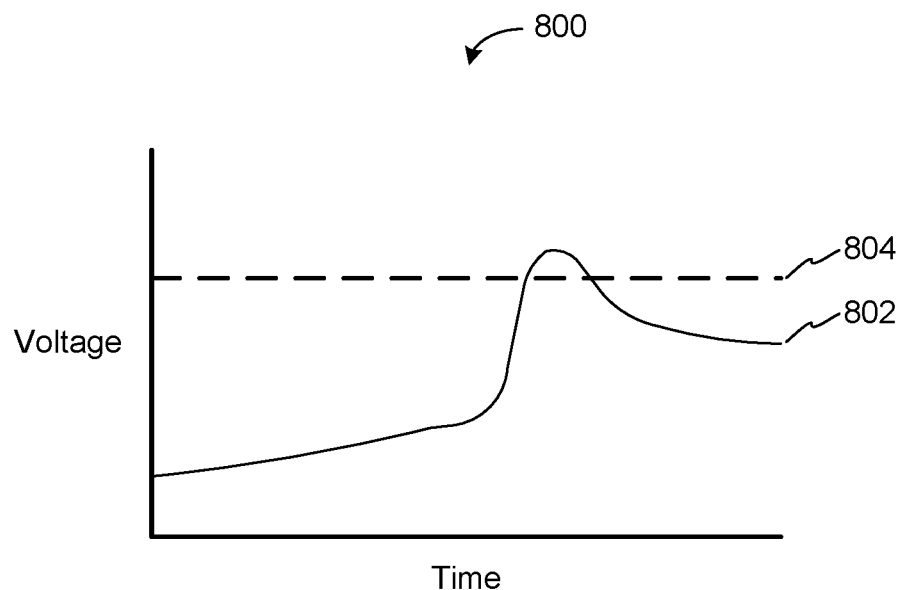
FIGS. 8A and 8B show voltage graphs, consistent with some implementations of the present concepts.
Figure 8B:
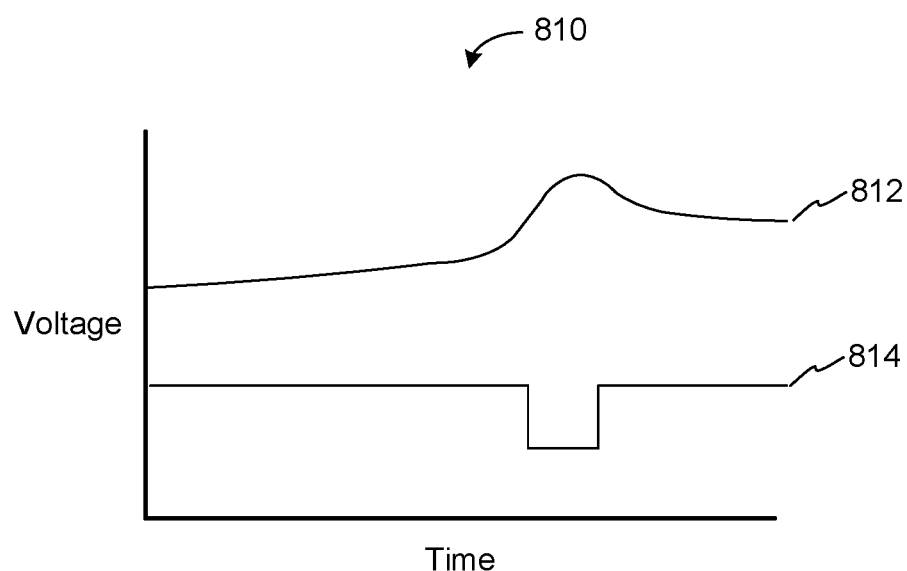

FIGS. 8A and 8B show an input voltage graph 800 and an output voltage graph 810, consistent with some implementations of the present concepts. For example, the input voltage graph 800 in FIG. 8A may show the voltage of an input signal 802 and a threshold voltage 804. In one implementation, the input signal 802 may be an input to a current sense amplifier, and the threshold voltage 804 may set the threshold of a comparator. FIG. 8B may show a voltage out (Vout) 812 and an alert signal 814. The Vout 812 may be the voltage output by the current sense amplifier, which may also be an input to the comparator. The alert signal 814 may be the output from the comparator.

Accordingly, as the input signal 802, which may depend on the current flowing through a shunt resistor between a power source and a load, rises above the threshold voltage 804, and therefore the Vout 812 rises, the comparator may be triggered and the alert signal 814 may flip. In this example, a low voltage of the alert signal 814 may indicate an alert, whereas a high voltage of the alert signal 814 may indicate no alert. However, the opposite polarity is possible as well, where a high voltage of the alert signal 814 may indicate an alert. Preferably, the current comparator may have a fast response so that increasing power loads that cross the threshold can throw an alert quickly to avoid a brownout.

Figure 9:
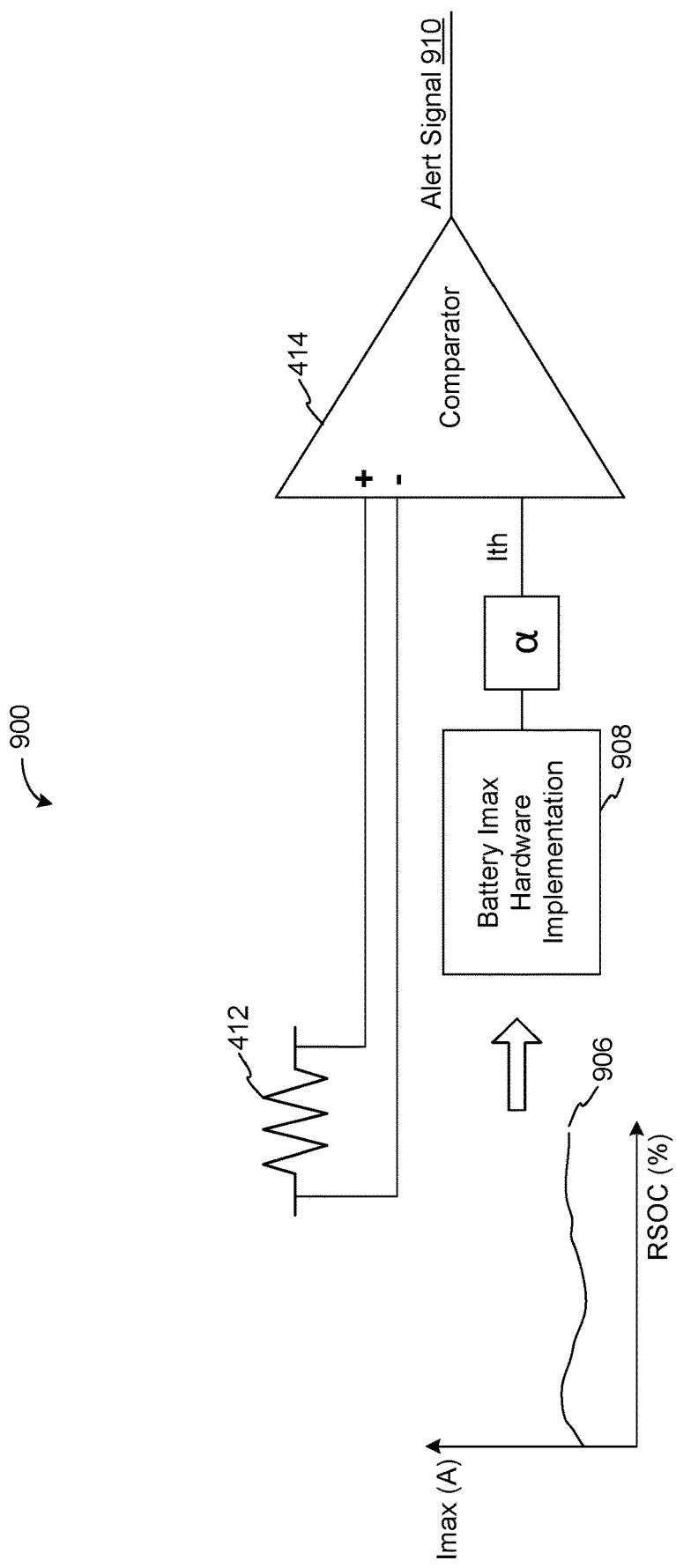
FIG. 9 shows a diagram of an example threshold implementation, consistent with the present concepts.

FIG. 9 shows a diagram of an example threshold implementation 900, consistent with some implementations of the present concepts. The threshold implementation 900 may be a hardware implementation of the current threshold Ith.

In this example, the threshold implementation 900 may include the sensor 412, such as a sense resistor, in the power delivery path from the power source 403 (e.g., the battery 402) to the system components 407. The threshold implementation 900 may include the comparator 414, such as a current comparator for comparing the current measured across the sensor 412 with the current threshold Ith.

As shown in the example current graph 906 in FIG. 9, the maximum current capability (Imax) information may be read from the battery 402 and then converted into hardware 908. Then, the current threshold Ith implemented by the comparator 414 may be set by scaling the battery Imax by a scaling factor $\alpha$ (e.g., Ith=Imax×$\alpha$). For example, the scaling factor $\alpha$ may be 90%, 80%, or any other value. Thus, the current threshold Ith may be scalable, for example, at a certain percentage below battery Imax. The current threshold Ith may be fixed or variable. In one implementation, battery Imax may be read continuously or periodically and any change in battery Imax may be used to change the current threshold Ith accordingly using the same scaling factor $\alpha$.

The comparator 414 may trigger an alert by outputting an alert signal 910 that is high if the measured current exceeds the current threshold Ith. The alert signal 910 may be processed by additional hardware and/or software to dynamically control peak power of the system components 407, such as the CPU 408 and the GPU 410.

Figure 10:
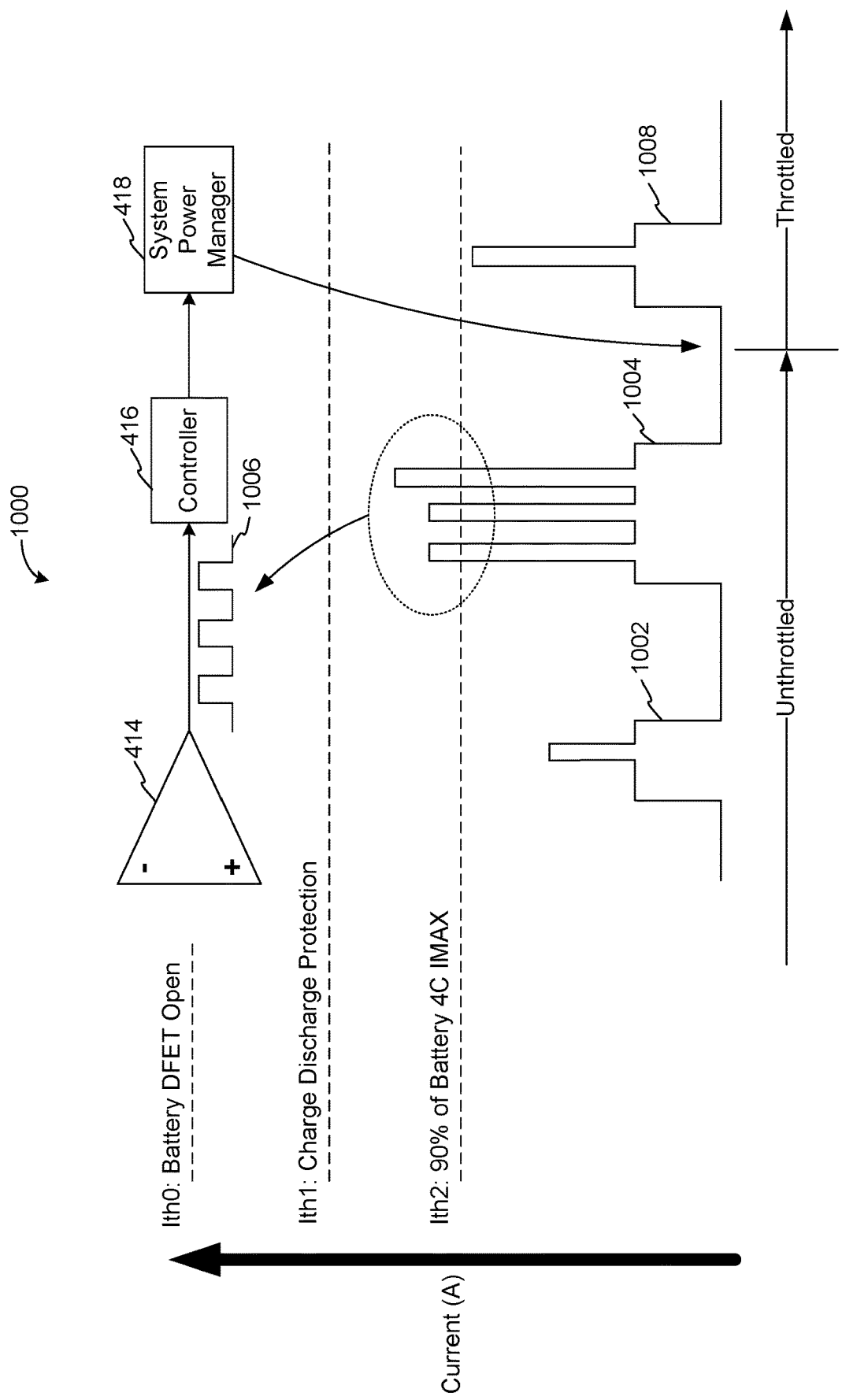
FIG. 10 shows a diagram of an example throttling implementation, consistent with the present concepts.

FIG. 10 shows a diagram 1000 of an example throttling implementation, consistent with the present concepts. This example may illustrate one way to control the peak power of the system 404. In this example, three thresholds (i.e., Ith0, Ith1, and Ith2) may be implemented. Ith0 may be set as a battery DFET open threshold, Ith1 may be set as a charger discharge protection threshold that implements PROCHOT at 105% of battery Imax, and Ith2 may be set at 90% of battery Imax.

The diagram 1000 shows an example of peak power workload profile that includes three power spikes, measured as current spikes. A first current spike 1002 may be generated by the system components 407, such as the CPU 408 and/or the GPU 410, while the system power manager 418 is not throttling the system components 407. The first current spike 1002 may fall below Ith2. Therefore, the comparator 414 may not be triggered and thus may output a low alert signal. The system power manager 418 may be programmed not to throttle the system components 407 in response to the first current spike 1002. Since the first current spike 1002 may not present a risk of a brownout, the performance of the system components 407 need not be unnecessarily limited. This is an improvement over conventional techniques that sacrifice performance regardless of whether there is an actual risk of a brownout.

A second current spike 1004 may be generated by the system components 407 while they are not being throttled. The second current spike 1004 may exceed Ith2 but fall below Ith1. Therefore, the comparator 414 may output a high alert signal 1006. The controller 416 may count the number of pulses and/or the duration of the pulses in the high alert signal 1006, and then transmit this data to the system power manager 418. In response, the system power manager 418 may be configured to throttle one or more of the system components 407 (e.g., the CPU 408 and/or the GPU 410) based at least in part on an algorithm that interprets the data from the controller 416 indicating that the peak power of the system components 407 is exceeding a threshold. That way, the system power manager 418 can prevent the system 404 from crashing. How soon the system power manager 418 throttles (e.g., after how many pulses or how frequently the pulses need to be triggered to initiate throttling), by how much the system power manager 418 throttles (e.g., by how many watts or by how many power states), and which system components 407 the system power manager 418 throttles (e.g., the CPU 408 or the GPU 410, or both) may be determined by an algorithm programmed in the software of the system power manager 418. The throttling engaged by the system power manager 418 may decrease the power consumption and performance of the system components 407, and thereby avoid a brownout.

A third current spike 1008 may be generated by the system components 407 while they are being throttled. The third current spike 1008 may fall below Ith2. Therefore, the comparator 414 may output a low alert signal to the controller 416, and the system power manager 418 may receive data from the controller 416 reflecting this information. Depending on how the system power manager 418 is programmed, the system power manager 418 may unthrottle the system components 407 (e.g., the CPU 408 or the GPU 410, or both) if Ith2 is not met for some time.

In some implementations, the system power manager 418 may be programmed with an algorithm, such that if the system components 407 generate really high current spikes often, then the system power manager 418 may gradually increase the throttle and thus gradually decrease the performance, so that the user is less likely to notice the performance hit. That is, the system power manager 418 may not immediately and drastically throttle upon the very first current spike that exceeds Ith2. For example, it may take the system power manager 418 about 10 second to adjust the throttle level after the first current spike that exceeds Ith2. The system power manager 418 may have the ability to cap the power usage of variable power consumption components, such as the CPU 408 and the GPU 410. The system power manager 418 may be able to increase or decrease the power consumption of the system components 407 in, for example, milliwatt range control, depending on how the system components 407 are configured for performance control. Moreover, if the measured current on the input side does not hit Ith2 for a certain period of time, then the system power manager 418 may gradually decrease the throttle and thereby increase performance. Thus, the present concepts do not throttle the system unnecessarily.

In some circumstances, the system power manager 418 may reach an equilibrium between throttling and unthrottling, such that power spikes of the system components have been suppressed sufficiently to avoid brownouts while still allowing the highest performance possible under the circumstances. Such an equilibrium may be short-lived or may last an extended period of time, depending on whether the utilization of and/or power consumption by the system components 407 remain steady or change significantly.

Thus, there may be an ongoing balancing act performed by the system power manager 418. The system power manager 418 may continue to receive current and updated data from the controller 416 and adaptively throttle and unthrottle as appropriate.

In the case where the system power manager 418 does not throttle enough and/or does not throttle quickly, then the current spikes may exceed Ith1 and cause the PROCHOT signal to be triggered. As described above, the charger may include hardware protection, such as a PROCHOT trigger set at 105% of battery Imax. However, triggering PROCHOT may be undesirable because PROCHOT limits system performance greatly. Therefore, to avoid this undesirable fallback protection, Ith2 may be set sufficiently below the battery Imax (for example, at 90%) to give the system power manager 418 sufficient time and enough margin to react by throttling the system 404 when current spikes reach Ith2 but not Ith1 yet.

In the simplified example illustrated in FIG. 10, the second current spike 1004 exceeds Ith2 three times. Thus, the comparator 414 may alert the controller 416 that the measured current exceeded Ith2 three times and/or the time durations of the second current spike 1004 exceeding Ith2. The present concepts offer many different ways to handle the alert signals. In one implementation, the controller 416 may sample the alert signal from the comparator 414 and keep a running counter that, for example, counts up when the alert signal is high and counts down when the alert signal is low. The counter may operate within a range between a minimum and a maximum. Therefore, the current value of the counter may roughly reflect the current power usage. If the measured current often exceeds Ith2, then the counter may count up and reach the maximum. This may cause the system power manager 418 to throttle the system components 407 and decrease system performance. Then, the current spikes may decrease, and the measured current may stop exceeding Ith2. This may cause the counter to count down (e.g., to zero or to a negative minimum). Then, the system power manager 418 may release the throttle and increase system performance. In some implementations, the counter may reset (e.g., to zero) after the system power manager 418 reacts to the counter reaching its minimum or maximum. Ultimately, the system power manager 418 may reach a balanced equilibrium. As explained above, in some implementations, the system power manager 418 may not begin to throttle immediately after the measured current hits Ith2 once, because such a one-time spike may not necessarily mean that the system 404 is crashing. There may be a margin or a buffer even above Ith2 that is set at 90% in which the system power manager 418 can adaptively react to the power spikes and adjust the performance of system components 407 to avoid a brownout.

In some implementations, the system power manager 418 may know that the total peak current of the system 404 is exceeding a current threshold but may not know which specific component is consuming a lot of power and is the primary cause of the high current spike. In such a scenario, the system power manager 418 may decrease the overall performance of all variable power consumption components in the system 404. There may be biasing incorporated into the algorithm, such that the system power manager 418 may cap the peak power of the CPU 408 more than the GPU 410, for example. Alternatively, the system power manager 418 may poll or be provided with information on the utilization level (e.g., CPU usage or GPU usage) or power consumption level of one or more individual system components 407. In such an implementation, the system power manager 418 may be programmed to target individual system components 407 that are currently causing or contributing to the power spikes for specific targeted throttling rather than general throttling.

In some implementations, additional current comparators may be used to implement additional current thresholds. For example, Ith3 may be set at 80% of battery Imax, and Ith4 may be set at 70% of battery Imax. Any number of thresholds and any scaling factor $\alpha$ is possible for the thresholds. Also, in some implementations, the scaling factor $\alpha$ may be fixed in hardware, and in other implementations, the scaling factor $\alpha$ may be variable or adjustable. Therefore, the controller 416 may receive multiple alerts signals from the multiple current comparators. The controller 416 may implement multiple counters for the multiple current comparators, and compile all relevant data for the system power manager 418 to process and react accordingly.

Implementing multiple current thresholds at various scaling factors can inform the system power manager 418 about the amplitudes of the current spikes, for example, whether a current spike exceeds the 70% threshold, 80% threshold, and/or 90% threshold. That is, a small current spike may exceed only the 70% threshold, whereas a large current spike may exceed all three (70%, 80%, and 90%) thresholds. Thus, the lower thresholds can provide the system power manager 418 with an early warning before current spikes reach the higher thresholds. In one implementation, the system power manager 418 may throttle a small degree in response to the measured current exceeding Ith4 at 70%, throttle more in response to the measured current exceeding Ith3 at 80%, and throttle a larger degree in response to the measured current exceeding Ith2 at 90%.

In some implementations, the system power manager 418 may use rule-based algorithms and/or machine-learning algorithms. That is, the system power manager 418 may tune its throttling algorithm using artificial intelligence. For the development of the algorithm, a large number of devices may send telemetry and information, which may be used as training data to develop a machine-learning model.

Alternatively or additionally, machine learning may be performed on a specific device (i.e., device-level learning). Each system may have specific components, such as CPUs and GPUs, which may have their own unique power characteristics. Even if two components have the same manufacturer, same model, and same design, they may still have different power characteristics. Moreover, power characteristics of a component can change over time with use and age. Therefore, a device-level machine-learning model may be trained on the actual device in which the model will be used and be specifically tailored to that device.

The artificial intelligence algorithm may be adaptive in that the algorithm can change to become more aggressive or more conservative as it learns to react to power spikes. If the components use a lot of power and create more power spikes, then the algorithm may adapt to throttle more, especially if brownouts occur as negative feedback to the training process. If the throttling turns out to be overly aggressive, performance suffers too much, and power spikes are not exceeding the threshold, then the algorithm may adapt to throttle more conservatively. Such a feedback loop can automatically adapt to various factors and operate as a self-learning system.

The learning algorithm and/or the software on the system power manager 418 in operation may receive many different types of information including, for example, peak power amplitudes and durations, battery RSOC, battery Imax, battery Pmax, application utilization, component models, component power states, component utilization, time, date, or any other information that can help train a model and/or help the system power manager 418 manage peak power. For example, the peak power values in FIGS. 1A and 1B may be used for programming the system power manager 418 and/or conducting device-level learning. Learning may involve receiving information from the controller 416 (e.g., the counter information). Learning may consider a myriad of factors, including how often the current thresholds are surpassed, how often the counters are increased or decreased, etc.

For example, from the telemetry information from many devices, the algorithm may have learned that a new computer running many updates and running certain applications for the first time can cause frequent power spikes. Moreover, a device-specific algorithm may have learned over time (for example, using adaptive linear regression) that specific applications often cause power spikes of a certain magnitude. There can be many smart ways to implement the system power manager 418, and the algorithm can be highly customizable and configurable. If the current thresholds (e.g., Ith2, Ith3, and so on) are sufficiently below the PROCHOT trigger level (e.g., Ith1), the system power manager 418 may not have to react immediately to every current spike. Therefore, there may be some margin for the system power manager 418 to use a learning model to more efficiently throttle the system components 407. The speed at which the system power manager 418 throttles or unthrottles may be modifiable. It may be undesirable to have the throttling and unthrottling to be very noticeable to a user as jumpy or choppy performance. The learning model can help achieve a balance gradually.

Using a machine-learning model may provide several technical advantages. First, a machine-learning model can continue to adapt to changing power characteristics of power sources, system components, and applications over time, whereas a rule-based model may be more rigid or require manual updating. Second, a machine-learning model may be better able to balance the level of throttling to avoid brownouts while still providing high performance. Since a machine-learning model can change its throttling algorithm in response to specific and recent feedback, it may provide a more fine-tuned throttling mechanism than a rule-based algorithm. Third, a machine-learning model may be better equipped to handle new and unknown variables (e.g., a new battery pack, a new CPU, a new GPU, and/or a new application), because a machine-learning model may be able to use its training from past telemetry and/or historical information of known conditions to quickly adapt and deal with new conditions.

Figure 11:
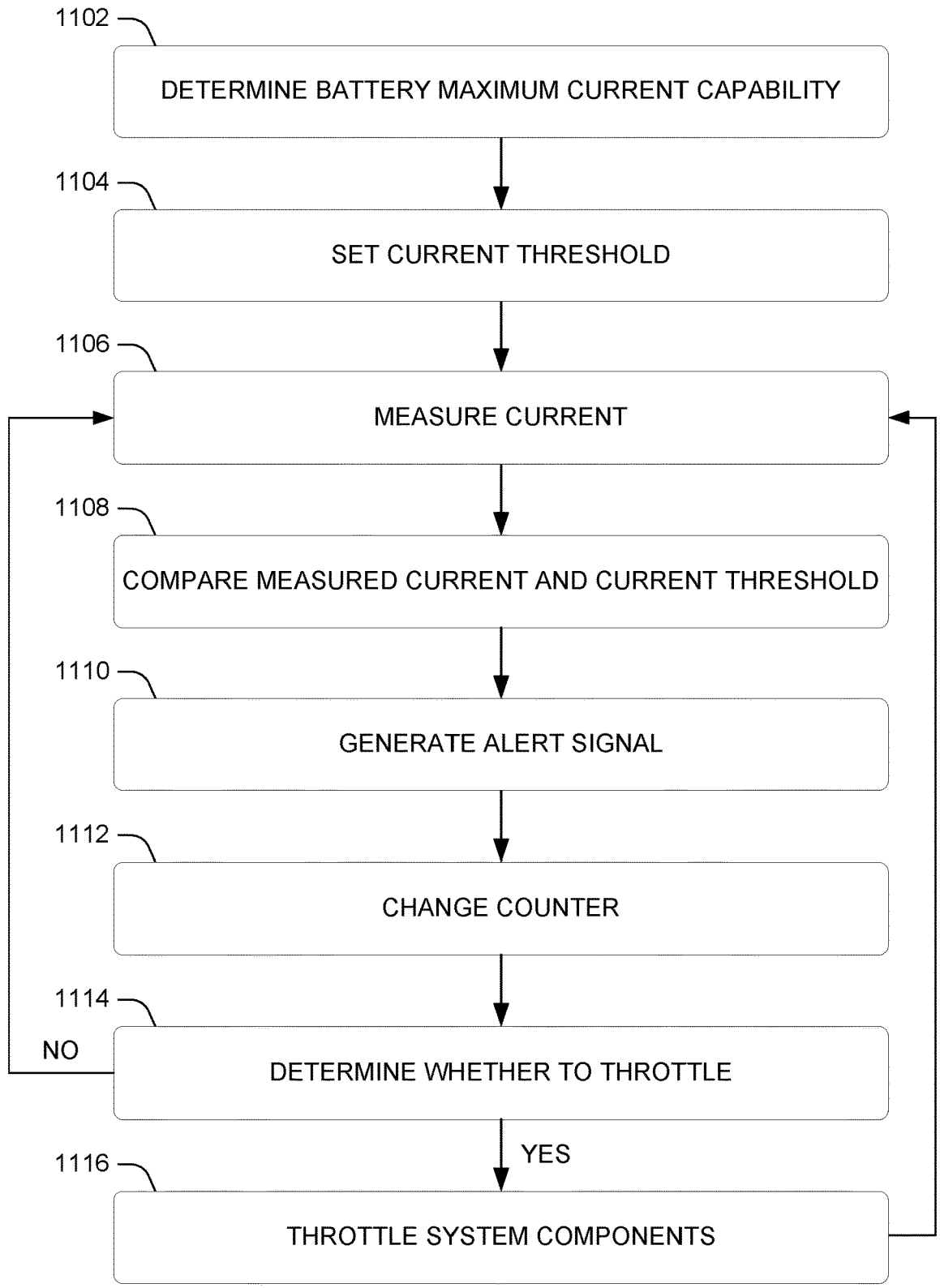
FIG. 11 shows a flow diagram of an example dynamic peak power control method, consistent with the present concepts.

FIG. 11 shows a flow diagram of an example dynamic peak power control method 1100, consistent with the present concepts. The dynamic peak power control method 1100 is presented for illustration purposes and is not meant to be exhaustive or limiting. The acts in the dynamic peak power control method 1100 may be performed in the order presented, in a different order, or in parallel or simultaneously, or may be omitted. Any or all of the acts in the dynamic peak power control method 1100 may be performed by software, hardware, or a combination of both.

In act 1102, the maximum current capability (Imax) of a battery may be determined. This information may be polled from the battery gas gauge one time or periodically on an ongoing basis. Imax may depend on the chemistry of the battery, temperature, RSOC, age of the battery, etc.

In act 1104, a current threshold may be set based at least in part on Imax determined in act 1102. The current threshold may be set in hardware using a fast current comparator or may be set in software, or in combination. The current threshold may be set lower than the Imax so that system components can be throttled before current spikes reach or exceed Imax and potentially cause brownouts or trigger PROCHOT. In one implementation, a scaling factor of 90% of Imax may be used to set the current threshold. Furthermore, in one implementation, the current threshold may be updated in response to changes in Imax.

In act 1106, the current flowing out of the battery may be measured. The measured current may be dependent on the power consumption of the system components. Therefore, the measured current may spike in response to the peak power generated by the system components. In one implementation, the current may be measured using a shunt resistor near the battery and a current sense amplifier. There may be many alternative techniques for measuring current that may be used.

In act 1108, the current measured in act 1106 may be compared with the current threshold set in act 1104. In one hardware implementation, a fast current comparator may be used to compare the measured current against the current threshold. Alternatively, software may be used to perform the comparison of the measured current value and the current threshold value.

In act 1110, an alert signal may be generated in response to the comparison in act 1108. For example, a hardware current comparator may output a binary high-or-low voltage signal, where a high voltage may indicate that the measured current exceeds the current threshold and a low voltage may indicate that the measured current is below the current threshold. The opposite polarity for the alert signal may be used.

In act 1112, a counter may be changed based at least in part on the alert signal. In one implementation, the alert signal may be sampled periodically. The counter value may be incremented if the sampled alert signal is high and decremented if the sampled alert signal is low. The alert signal may be constrained within a range from a minimum to a maximum.

In act 1114, a determination may be made on whether to throttle, unthrottle, or maintain the current throttle level based at least in part on the counter changed in act 1112. The determination may be made by a rule-based algorithm or a machine-learning algorithm that analyzes one or more factors, including the counter in act 1112. The algorithm may also base its determination on at least the current throttle level, the components in the system, the power states available for the components, applications running, utilization levels of applications and/or components, among others.

If act 1114 determines to maintain the current throttle level, then the dynamic peak power control method 1100 may return to act 1106 to continue monitoring the current being drawn from the battery. If act 1114 determines to increase or decrease the current throttle level, then the dynamic peak power control method 1100 may proceed to act 1116.

In act 1116, the system components may be throttled or unthrottled according to the determination made in act 1114. For example, one or more system components may be throttled by changing their power states to lower power-consuming states or by capping their maximum power states, which would decrease peak power and decrease performance. One or more system components may be unthrottled by changing their power states to higher power-consuming states or by raising their maximum power states, which would increase performance and increase peak power. Such a change to the throttle level may be made gradually rather than drastically so as to make the change less noticeable to the user. A gradual change may also help avoid the possibility of making big swings that may unnecessarily limit performance or cause brownouts.

After changing the throttle level in act 1116, the dynamic peak power control method 1100 may return to act 1106 to continue monitoring the current that is output by the battery, and therefore repeating acts 1106 through 1116. This loop may be repeated, for example, as long as the device is in operation, such that the dynamic peak power control method 1100 can dynamically adjust the throttle level of the device to avoid brownouts and also avoid unnecessarily decreasing performance. Accordingly, the dynamic peak power control method 1100 may run continuously regardless of the determination made in act 1114 and the throttling or unthrottling action taken in act 1116. Furthermore, the throttling or unthrottling action taken in act 1116 may affect the future current measurements sensed in act 1106 in future loops of the dynamic peak power control method 1100.

Figure 12:
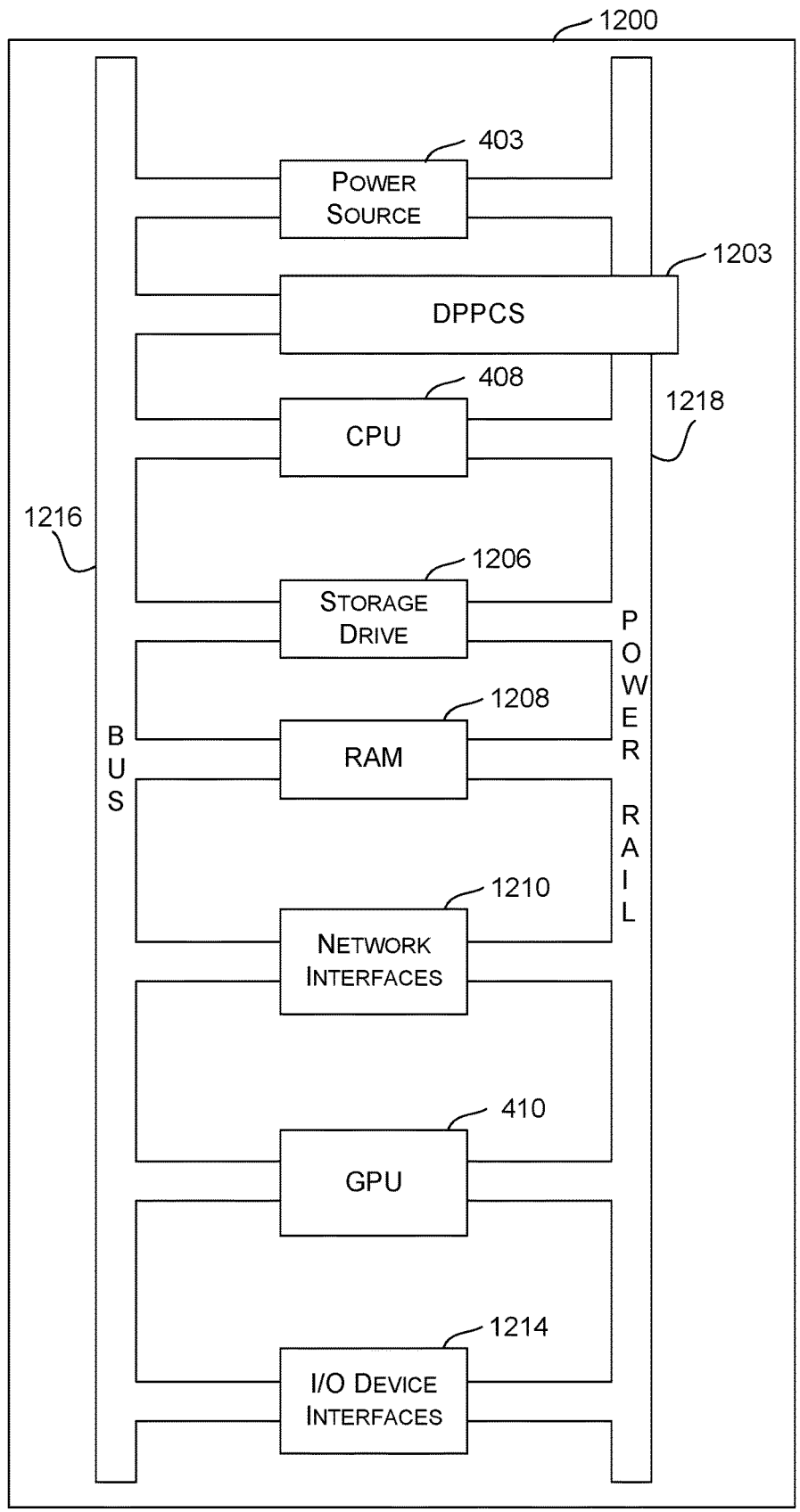
FIG. 12 shows an example electronic device, for which the present concepts may be implemented.

FIG. 12 shows an example electronic device 1200, for which the present concepts may be implemented. For example, the electronic device 1200 may include a personal computer (PC), desktop computer, server, mainframe computer, notebook computer, workstation, kiosk, cellular phone, smartphone, personal digital assistant (PDA), tablet or pad-type computer, mobile computer, camera, appliance, virtual reality headset, video game console, controller, smart device, IoT device, watch, wearable, set-top box, game system, automobile entertainment or navigation console, printer, television, etc., and/or any of a myriad of ever-evolving or yet to be developed types of electronic device that consumes power. The advantages of the present concepts may be realized for devices that include one or more components that have a varying power usage range and have a power source that may not provide enough power to meet the demands of all components operating at their peak power states in certain circumstances. The electronic device 1200 in FIG. 12 is provided as an example to illustrate an implementation of the present concepts. Variations and alternative configurations are possible.

The term "device," "computer," or "computing device" as used herein can include any type of device that has processing capability and/or storage capability. Processing capability can be provided by circuit logic or a hardware processor that can execute data in the form of computer-readable instructions to provide a functionality.

The electronic device 1200 may include the power source 403, such as the battery 402 and/or the PSU 405. In some implementations, the PSU 405 may receive power from an AC source and charge the battery 402. As illustrated in FIG. 12, the power source 403 may supply power to the electronic device 1200 and to its components that use power. Although the power source 403 is illustrated in FIG. 12 as an internal component inside the electronic device 1200, the power source 403 may be external to the electronic device 1200. Furthermore, the electronic device 1200 may include multiple batteries and/or the battery 402 may include multiple battery cells.

The electronic device 1200 may include the dynamic peak power control system (DPPCS) 401, consistent with the present concepts. In some implementations, the DPPCS 401 may include the sensor 412, the comparator 414, the controller 416, and/or the system power manager 418 for controlling peak power of components in the electronic device 1200. The DPPCS 401 may, for example, throttle the power consumption and thus limit the performance of components to prevent brownouts while still providing the satisfactory user experience.

The electronic device 1200 may include one or more components of various types, depending on the nature, type, purpose, and/or function of the electronic device 1200. For example, the electronic device 1200 may include the CPU 408 for executing instructions, for example, machine-executable instructions that implement various aspects of the present concepts described herein. The CPU 408 may have multiple power states, such as those described above in connection with FIG. 1A. Although only one CPU 408 is shown in FIG. 12 for simplicity, the electronic device 1200 may include multiple CPUs. The CPU 408 may be a single processor, a multi-processor, single-core units, and/or multi-core units. The CPU 408 may perform processing to implement the present concepts, including all or part of the dynamic peak power control method 1100. Additionally or alternatively, the electronic device 1200 may include other types of processors, such as embedded microcontrollers (e.g., the controller 416 described above), a digital signal processor (DSP), etc.

The electronic device 1200 may include a storage drive 1206 for storing data, including programs, applications, operating systems, other machine-executable instructions, and/or user-related data. The storage drive 1206 may include computer readable storage media, such as magnetic disks, optical disks, solid state drives, removable memory, external memory, flash memory, volatile or non-volatile memory, hard drives, optical storage devices (e.g., CDs, DVDs etc.), and/or remote storage (e.g., cloud-based storage), among others. The storage drive 1206 may be internal or external to the electronic device 1200. Computer readable storage media can be any available media for storing information without employing transitory propagated signals. The storage drive 1206 may store instructions and/or data (e.g., the algorithm software for the system power manager 418 described above) for implementing the present concepts, including all or a part of the dynamic peak power control method 1100.

The electronic device 1200 may include random access memory (RAM) 1208 for loading active data, programs, applications, operating systems, and/or other machine executable instructions from the storage drive 1206. The RAM 1208 may be volatile and/or non-volatile memory. The RAM 1208 may be used by the CPU 408 to load, access, and manipulate instructions and/or data for implementing the present concepts.

The electronic device 1200 may include one or more network interfaces 1210 for interfacing with one or more networks to communicate with other computers, devices, and/or peripherals (e.g., networked storage, networked display, etc.). The network interfaces 1210 may include wired network interfaces for connecting to wired networks (e.g., ethernet) and/or wireless network interfaces for connecting to wireless networks (e.g., Wi-Fi, Bluetooth, cellular, etc.). In some implementations, the electronic device 1200 may communicate with other devices using the network interfaces 1210 to implement all or part of the present concepts.

The electronic device 1200 may include the GPU 410 for executing instructions related to graphics and for displaying graphics on a display screen. The GPU 410 may reside on a graphics card that is connected to an on-board display or an external display, and may include an interface for sending video signals to the display. The graphics card may also include graphics memory for storing instructions and/or data related to graphics. Alternatively, the GPU 410 may reside on the same PCB as the CPU 408. Although FIG. 12 illustrates the GPU 410 and the CPU 408 separately, the GPU 410 may be an integrated GPU that is on the same die as the CPU 408, for example, in a system on a chip (SoC). Although FIG. 12 illustrates only one GPU 410, the electronic device 1200 may include multiple GPUs. The GPU 410 may be a single processor, a multi-processor, single-core units, and/or multi-core units. The GPU 410 may have multiple power states, such as those described above in connection with FIG. 1B.

The electronic device 1200 may include input/output ("I/O") device interfaces 1214 for interfacing with one or more I/O devices, including peripherals, such as a keyboard, mouse, track pad, speaker, microphone, printer, scanner, facsimile machine, camera, remote control, joystick, game pad, stylus, touch screen, etc. A user or a computer may provide input to the electronic device 1200 or receive output from the electronic device 1200 using one or more of these I/O devices.

The electronic device 1200 may include a bus 1216. The bus 1216 may include multiple signal lines that connect various components of the electronic device 1200 and provide interfaces for those components to communicate and transfer signals, commands, and/or data among one another. For example, the DPPCS 401 may use the bus 1216 to receive parameters (e.g., Pmax and/or Imax) from the power source 403. The DPPCS 401 may use the bus 1216 to send command signals to the CPU 408 and/or the GPU 410 to switch their power modes for throttling.

The electronic device 1200 may include a power rail 1218. The power rail 1218 may include multiple power lines that connect various components of the electronic device 1200 to the power source 403. The power rail 1218 may be used by the power source 403 to supply power to the various components of the electronic device 1200. The sensor 412 of the DPPCS 401 may be implemented on the power rail 1218 to sense the power drawn from the power source 403 by the components of the electronic device 1200, consistent with some implementations of the present concepts.

The electronic device 1200 illustrated in FIG. 12 is merely one example. Many other types and configurations of the electronic device 1200 are possible. The electronic device 1200 may not include all or any of the components described above, and the electronic device 1200 may also include additional elements not explicitly described. The number and the types of components in the electronic device 1200 can vary widely, as the application of peak power management is virtually universal.

Generally, any of the functions described herein can be implemented using software, firmware, hardware (e.g., fixed-logic circuitry), or a combination of these implementations. The term "component," "module," or "logic" as used herein generally may represent software, firmware, hardware, circuitry, whole devices or networks, or a combination thereof. In the case of a software implementation of an aspect of the present concepts, these may represent program code that performs specified tasks when executed. The program code can be stored in one or more computer-readable memory devices, such as computer-readable storage media. The features and techniques of the component, module, or logic may be platform-independent, meaning that they may be implemented on a variety of commercial computing platforms having a variety of processing configurations.

Various examples are described above. Additional examples are described below. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims and other features and acts that would be recognized by one skilled in the art are intended to be within the scope of the claims.

Various examples are described above. Additional examples are described below. One example includes a device comprising components for using a variable amount of power, a power source for supplying power to the components, a comparator for comparing a current drawn from the power source with a current threshold and for outputting a signal based at least in part on the comparing, the current threshold being below a maximum current capability of the power source, and a manager for throttling the components to use a less amount of power based at least in part on the signal.

Another example can include any of the above and/or below examples where the device further comprises a sensor for sensing the current, where the comparator is configured to detect a voltage drop across the sensor.

Another example can include any of the above and/or below examples where a controller for receiving the signal from the comparator and outputting data based at least in part on the signal to the manager.

Another example can include any of the above and/or below examples where the controller includes a counter whose value depends at least in part on a number of times the current exceeds the current threshold.

Another example can include any of the above and/or below examples where the manager is configured to throttle a particular component based at least in part on the signal by setting a cap on an amount of power the particular component can use.

Another example can include any of the above and/or below examples where the manager is configured to unthrottle a particular component based at least in part on the signal by raising a cap on the amount of power the particular component can use.

Another example can include any of the above and/or below examples where the manager includes a machine-learning model for determining whether to throttle the components.

Another example can include any of the above and/or below examples where the machine-learning model is configured to determine a degree to which the components are throttled.

Another example includes a method comprising sensing a current output by a battery supplying power to a component, comparing the current and a current threshold and generating first feedback indicating that the current exceeds the current threshold, the current threshold being lower than a maximum current capability of the battery, and throttling the component to use less power based at least in part on the first feedback.

Another example can include any of the above and/or below examples where the method further comprises determining the maximum current capability of the battery and setting the current threshold as a percentage of the maximum current capability.

Another example can include any of the above and/or below examples where the method further comprises determining an updated maximum current capability of the battery and modifying the current threshold based at least in part on the updated maximum current capability.

Another example can include any of the above and/or below examples where the throttling includes changing a power state of the component.

Another example can include any of the above and/or below examples where the throttling includes setting a maximum power state of the component.

Another example can include any of the above and/or below examples where the method further comprises training a machine-learning model for determining whether and/or by how much to throttle the component in response to the first feedback.

Another example can include any of the above and/or below examples where the method further comprises unthrottling the component based at least in part on second feedback indicating that the current does not exceed the current threshold.

Another example can include any of the above and/or below examples where the unthrottling includes raising a maximum power state of the component.

Another example includes a system comprising a sensor for monitoring a current output of a power source for supplying power to a component, a first comparator for comparing the current output with a first threshold that is below a maximum current capability of the power source, a controller for providing feedback based at least in part on the comparing, and a manager for throttling a component to use less power in response to the feedback.

Another example can include any of the above and/or below examples where the sensor, the first comparator, the controller, and the manager are in an application-specific integrated circuit (ASIC).

Another example can include any of the above and/or below examples where the first threshold varies based at least in part on the maximum current capability of the power source.

Another example can include any of the above and/or below examples where the method further comprises a second comparator for comparing the current output with a second threshold, the second threshold being lower than the first threshold, where the manager throttles the components in response to the feedback that is based at least in part on the first threshold and the second threshold.

The invention claimed is:

1. A device, comprising: a component capable of operating at an operational power state being one of a plurality of power states for using a variable amount of power; a power source for supplying power to the component, the power source having a maximum current capability; a dynamic peak power control system for continuously reading the maximum current capability of the power source and continuously setting a variable current threshold as a certain percentage of the maximum current capability of the power source, the variable current threshold being below the maximum current capability of the power source; a comparator for comparing a current drawn from the power source with the variable current threshold and for outputting a signal based at least in part on the comparing; and a manager for changing-a maximum power state of the component based at least in part on the signal, the maximum power state being one of the plurality of power states, the operational power state being prevented from exceeding the maximum power state.

2. The device of claim 1, further comprising:
a sensor for sensing the current,
wherein the comparator is configured to detect a voltage drop across the sensor.

3. The device of claim 1, further comprising:
a controller for receiving the signal from the comparator and outputting data based at least in part on the signal to the manager.

4. The device of claim 3, wherein the controller includes a counter whose value depends at least in part on a number of times the current exceeds the variable current threshold.

5. The device of claim 1, wherein the manager is configured to lower the maximum power state of the component by setting or lowering a cap on an amount of power the component can use.

6. The device of claim 1, wherein the manager is configured to raise the maximum power state of the component by removing or raising a cap on an amount of power the component can use.

7. The device of claim 1, wherein the manager includes a machine-learning model for determining whether to lower or raise the maximum power state of the component.

8. The device of claim 7, wherein the machine-learning model is configured to determine a degree to which the maximum power state of the component is to be lowered or raised.

9. A method, comprising:
determining a maximum current capability of a battery supplying power to a component operating at an operational power state that is one of a plurality of power states;
setting a current threshold to be a certain percentage of the maximum current capability of the battery, the current threshold being lower than the maximum current capability of the battery;
continuously determining an updated maximum current capability of the battery;
modifying the current threshold to be the certain percentage of the updated maximum current capability of the battery;
sensing a current output by the battery;
comparing the current and the current threshold and generating first feedback indicating that the current exceeds the current threshold;
lowering a maximum power state of the component based at least in part on the first feedback, the maximum power state being one of the plurality of power states, the operational power state being prevented from exceeding the maximum power state.

10. The method of claim 9, wherein lowering the maximum power state includes changing a cap on a switching frequency of the component.

11. The method of claim 9, further comprising:
training a machine-learning model for determining whether and/or by how much to lower the maximum power state of the component in response to the first feedback.

12. The method of claim 9, further comprising:
generating second feedback indicating that the current does not exceed the current threshold; and
raising the maximum power state of the component based at least in part on the second feedback.

13. The method of claim 12, wherein raising the maximum power state includes raising a cap on a switching frequency of the component.

14. A system, comprising:
a dynamic peak power control system for continuously monitoring a maximum current capability of a power source for supplying power to a component and changing a first threshold based on the maximum current capability of the power source and a scaling factor, the first threshold being below the maximum current capability of the power source;
a sensor for monitoring a current output of the power source;
a first comparator for comparing the current output with the first threshold;
a controller for providing feedback based at least in part on the comparing; and
a manager for changing a maximum power state of the component in response to the feedback, an operational power state of the component being prevented from exceeding the maximum power state, the operational power state and the maximum power state being selected from a plurality of power states for the component.

15. The system of claim 14, wherein the sensor, the first comparator, the controller, and the manager are in an application-specific integrated circuit (ASIC).

16. The system of claim 14, further comprising:
a second comparator for comparing the current output with a second threshold, the second threshold being lower than the first threshold,
wherein the manager changes the maximum power state of the component in response to the feedback that is based at least in part on the first threshold and the second threshold.

17. The device of claim 5, wherein the manager lowers the maximum power state of the component by setting or lowering the cap on a switching frequency of the component.

18. The device of claim 1, wherein the variable current threshold is set below a Processor hot (PROCHOT) threshold for the power source.

19. The system of claim 14, wherein the manager lowers the maximum power state of the component in response to the feedback indicating that the current output exceeds the first threshold.

20. The system of claim 19, wherein the manager lowers the maximum power state of the component by lowering a cap on a switching frequency of the component.

* * * * *